(12) United States Patent
Tang et al.

(10) Patent No.: US 12,040,265 B2
(45) Date of Patent: Jul. 16, 2024

(54) HIGH-FREQUENCY CERAMIC PACKAGES WITH MODIFIED CASTELLATION AND METAL LAYER ARCHITECTURES

(71) Applicant: TEXAS INSTRUMENTS INCORPORATED, Dallas, TX (US)

(72) Inventors: Yiqi Tang, Allen, TX (US); Rajen Manicon Murugan, Dallas, TX (US); Li Jiang, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 128 days.

(21) Appl. No.: 17/387,794

(22) Filed: Jul. 28, 2021

(65) Prior Publication Data

US 2023/0035716 A1 Feb. 2, 2023

(51) Int. Cl.
H01L 23/498 (2006.01)
H01L 23/13 (2006.01)
H01P 3/02 (2006.01)
H05K 1/02 (2006.01)

(52) U.S. Cl.
CPC ........ *H01L 23/49838* (2013.01); *H01L 23/13* (2013.01); *H01L 23/49805* (2013.01); *H01L 23/49822* (2013.01); *H01P 3/02* (2013.01); *H05K 1/0243* (2013.01)

(58) Field of Classification Search
CPC . H05K 1/0243; H01L 23/49838; H01L 23/13; H01L 23/49805; H01L 23/49822; H01P 3/02

See application file for complete search history.

(56) References Cited

U.S. PATENT DOCUMENTS

| | | | | |
|---|---|---|---|---|
| 4,551,747 A | * | 11/1985 | Gilbert | H01L 23/10 257/691 |
| 5,369,551 A | * | 11/1994 | Gore | H05K 3/3426 361/767 |
| 9,538,636 B1 | * | 1/2017 | Weigand | H01L 23/14 |
| 11,121,048 B1 | * | 9/2021 | Xiong | H01L 23/055 |
| 2002/0051344 A1 | * | 5/2002 | Gottswinter | H05K 9/0022 361/742 |
| 2006/0055432 A1 | * | 3/2006 | Shimokawa | H01L 21/565 257/E23.125 |
| 2014/0151105 A1 | * | 6/2014 | Kuwahara | H03H 9/1021 174/250 |
| 2015/0188025 A1 | * | 7/2015 | Otake | H10N 30/88 206/701 |
| 2015/0255702 A1 | * | 9/2015 | Takebayashi | H05K 1/0298 174/250 |
| 2022/0247058 A1 | * | 8/2022 | Len | H05K 1/0263 |

* cited by examiner

*Primary Examiner* — Michael Jung
(74) *Attorney, Agent, or Firm* — Dawn Jos; Frank D. Cimino

(57) ABSTRACT

In examples, a semiconductor package comprises a ceramic substrate and a horizontal metal layer covered by the ceramic substrate. The metal layer is configured to carry signals in the 5 GHz to 38 GHz frequency range. The package also includes a vertical castellation on an outer surface of the ceramic substrate, the castellation coupled to the metal layer and having a height ranging from 0.10 mm to 0.65 mm.

15 Claims, 24 Drawing Sheets

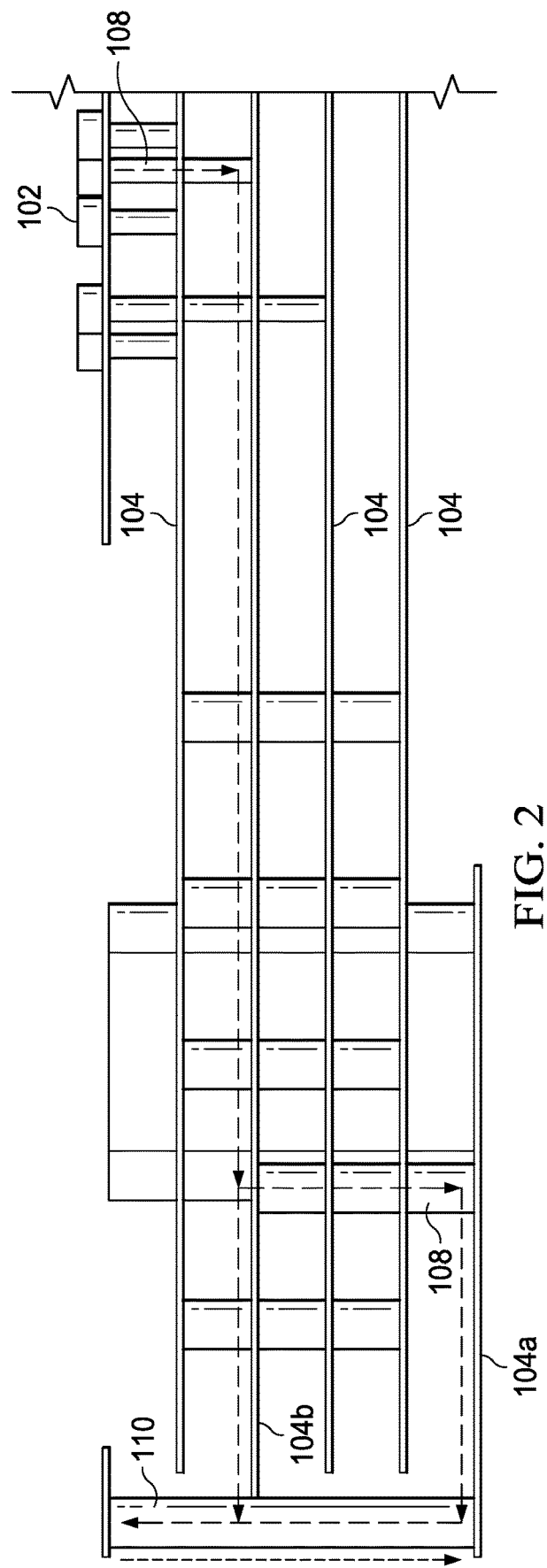

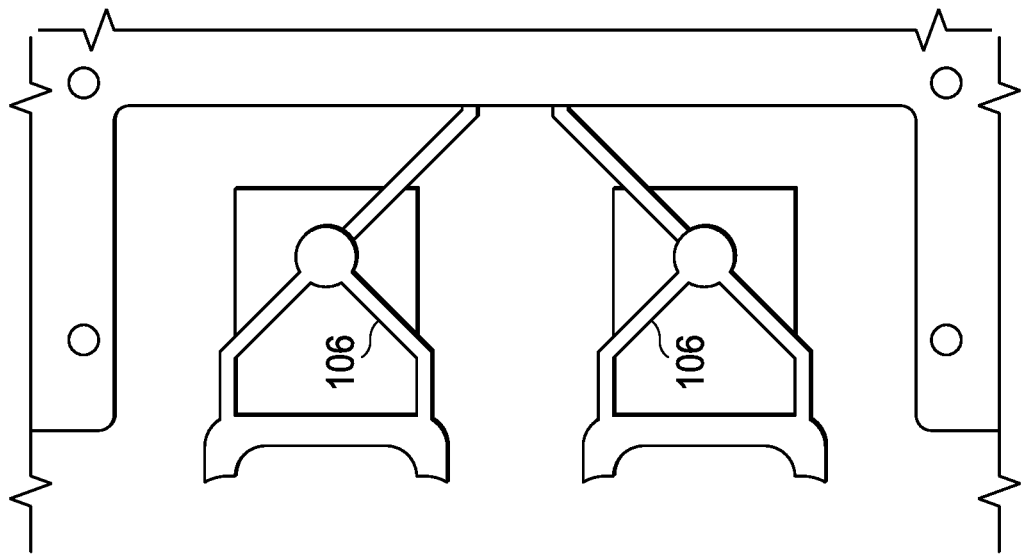
FIG. 3A2
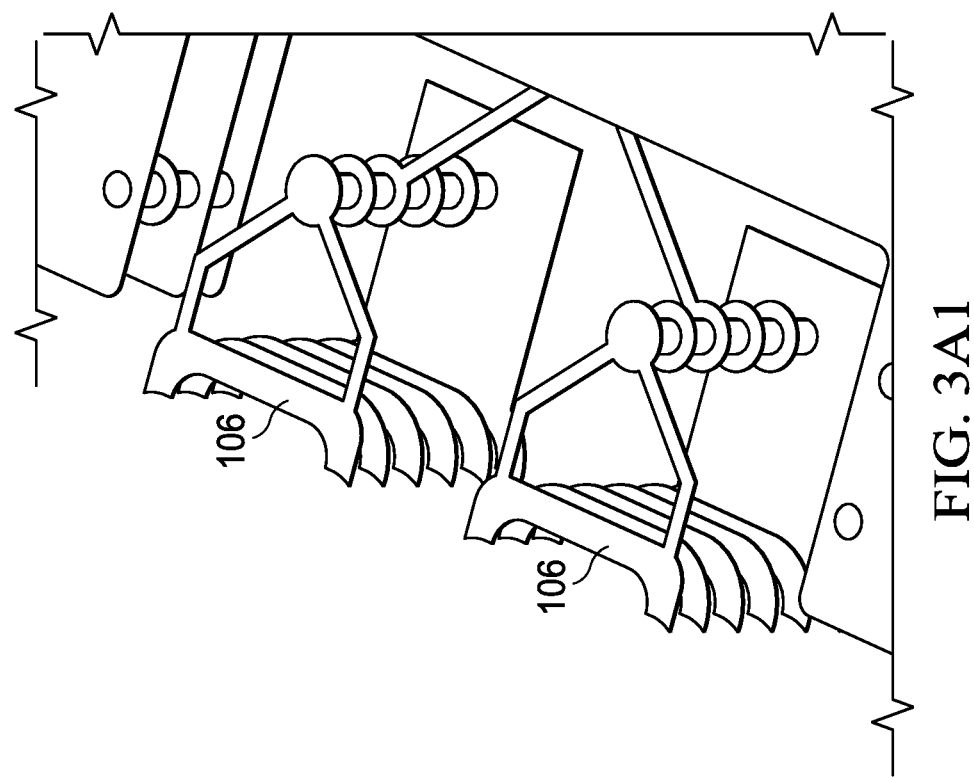
FIG. 3A1

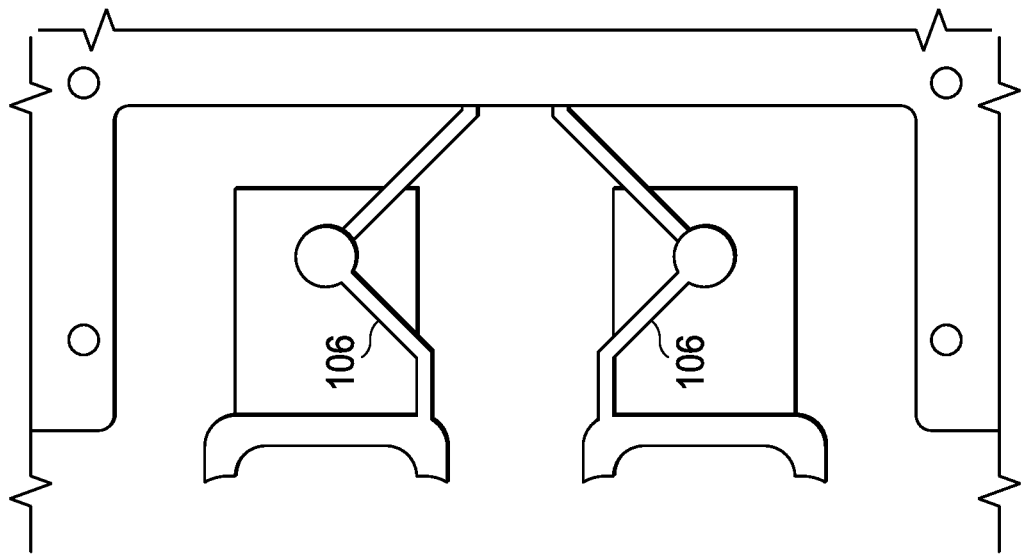
FIG. 3B2
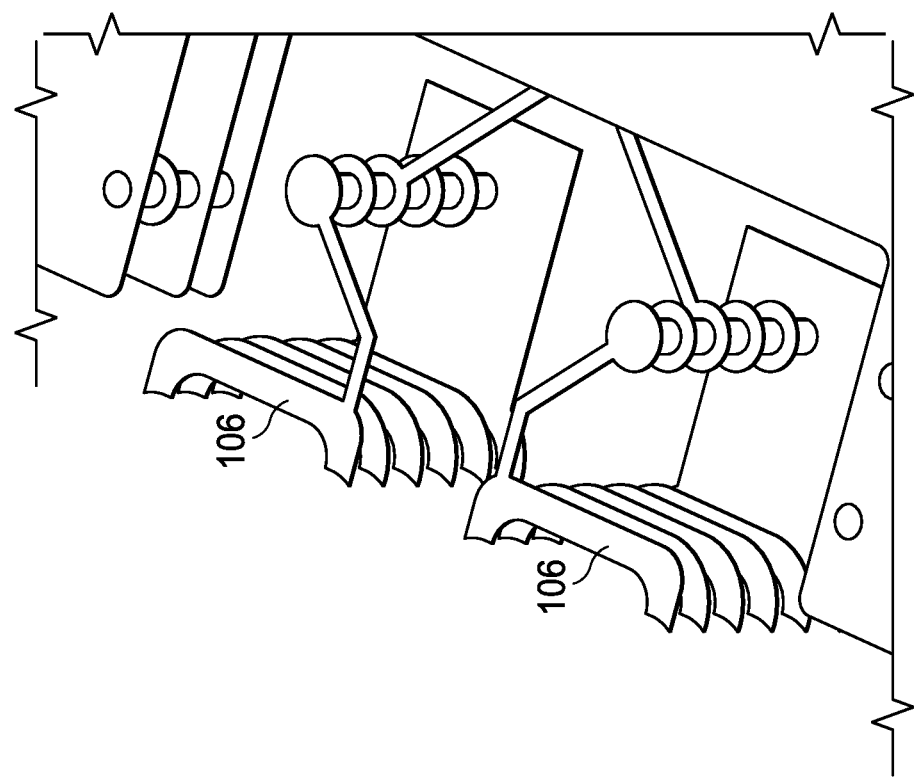
FIG. 3B1

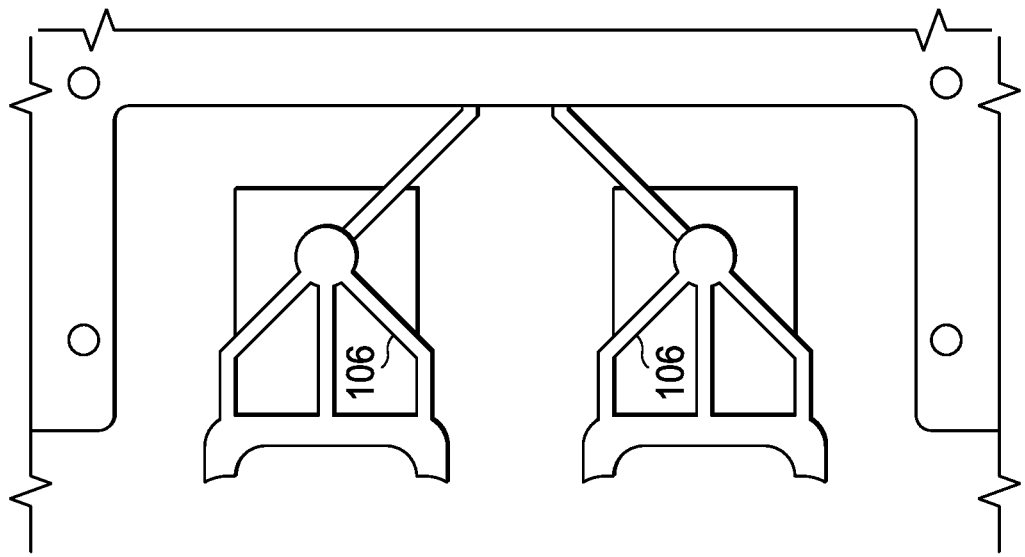
FIG. 3C2
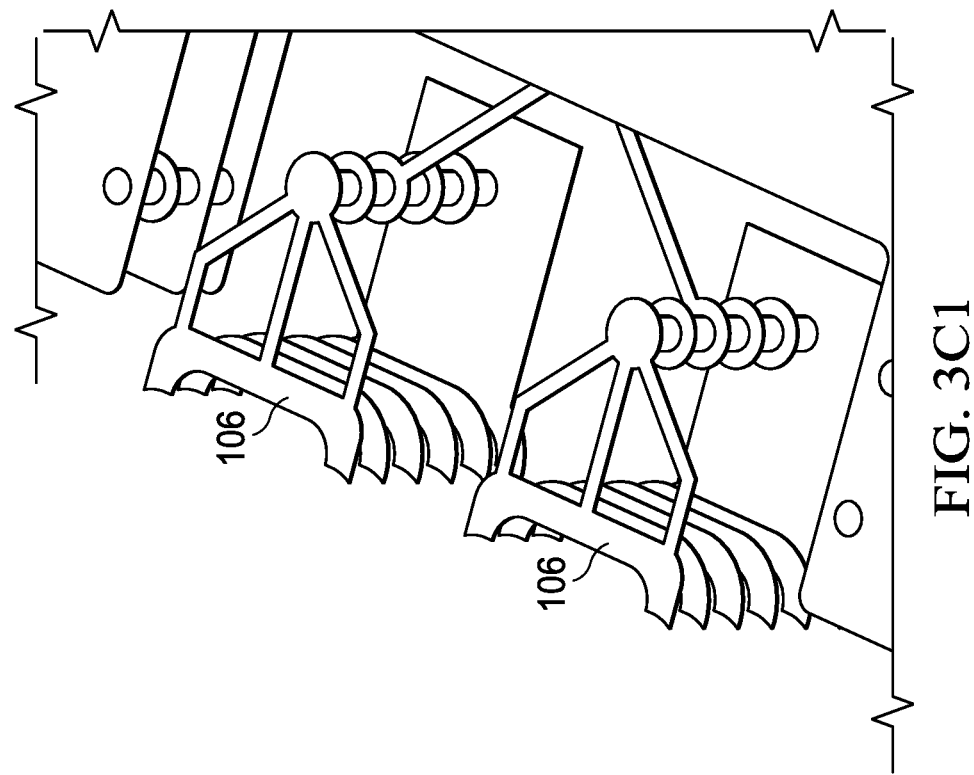
FIG. 3C1

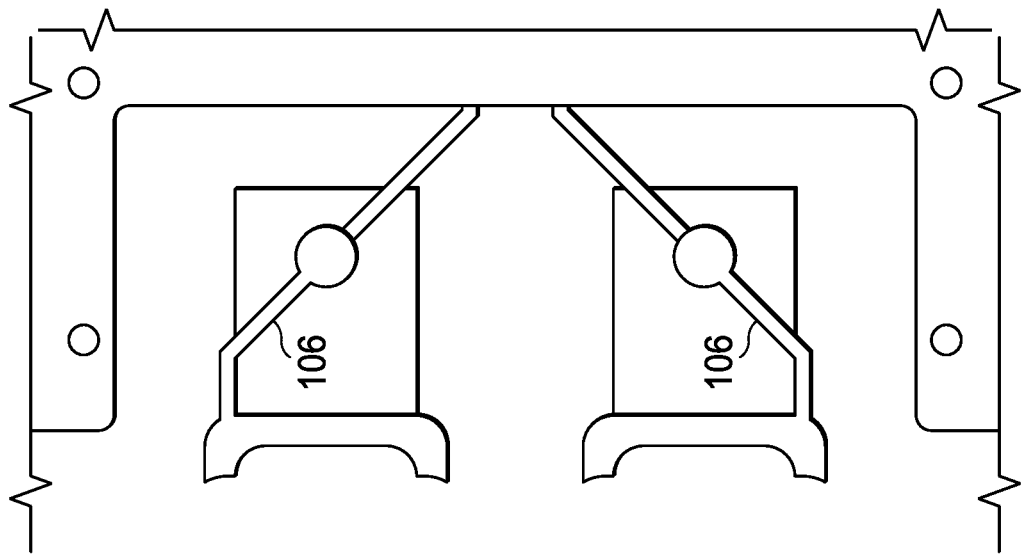
FIG. 3D2
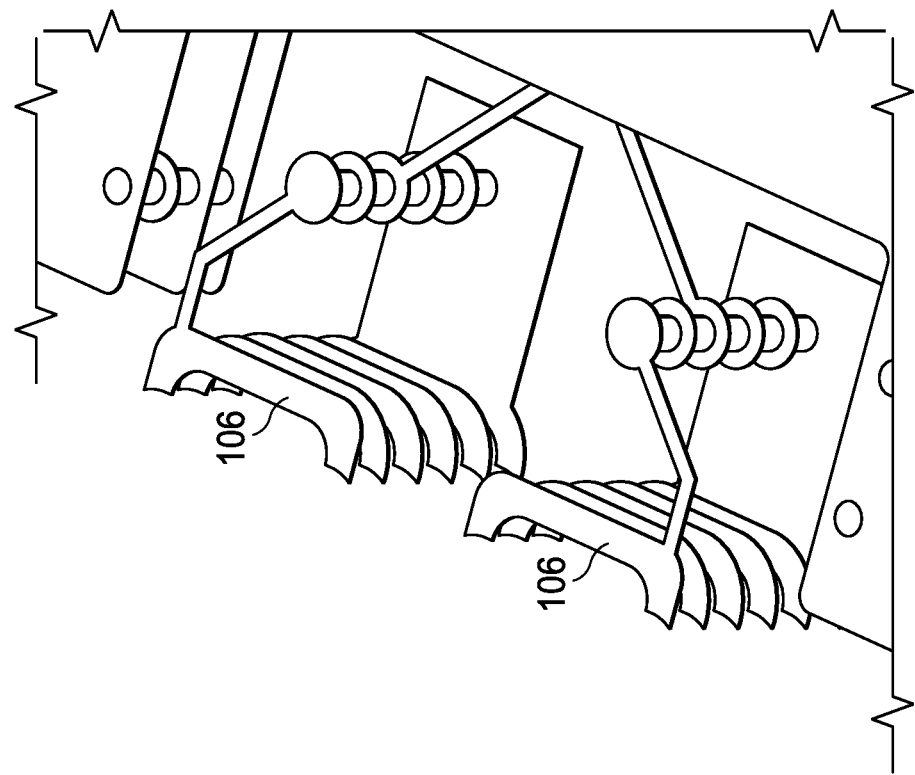
FIG. 3D1

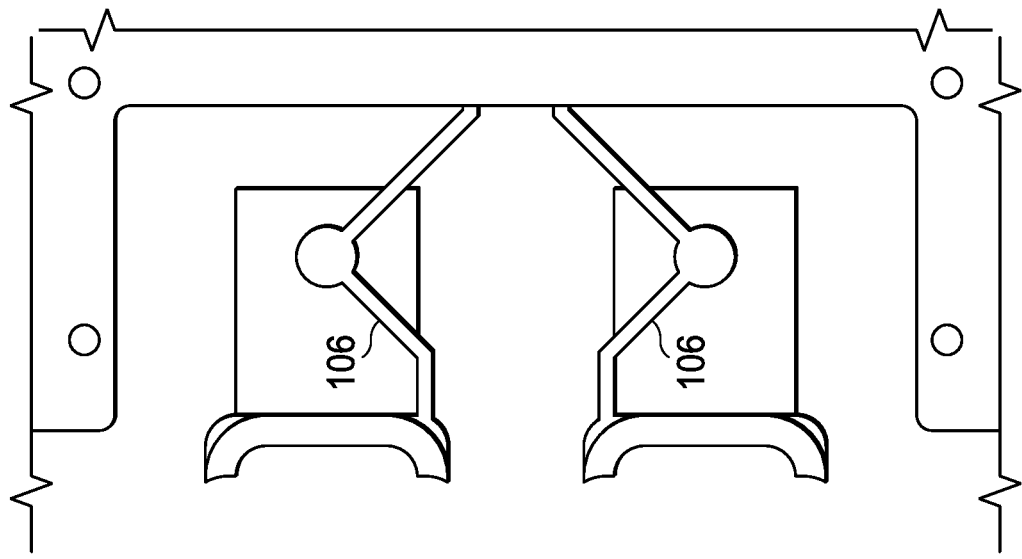
FIG. 3E2
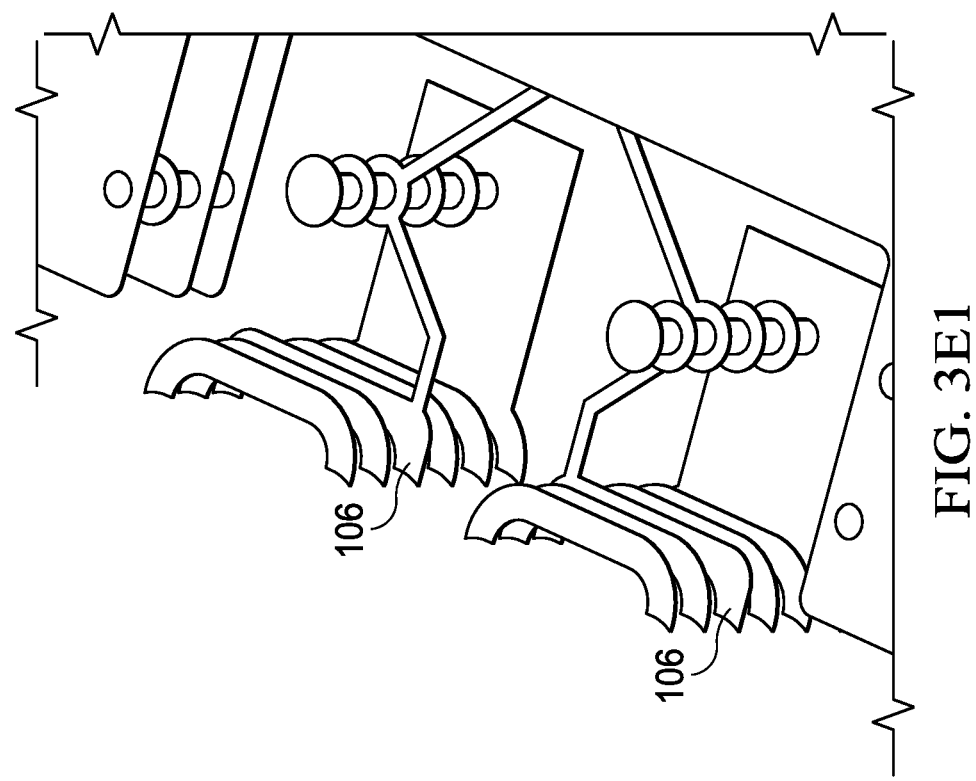
FIG. 3E1

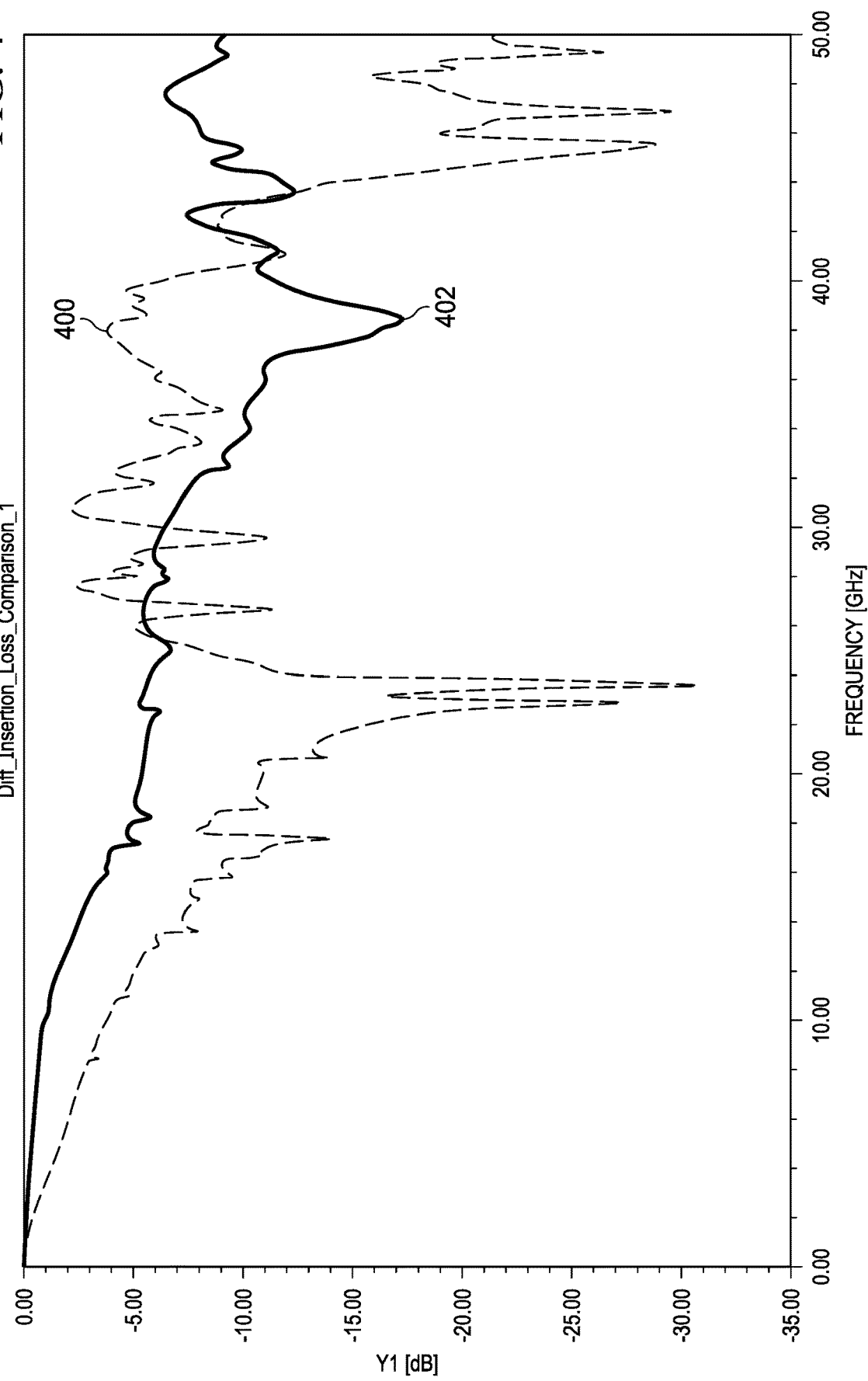

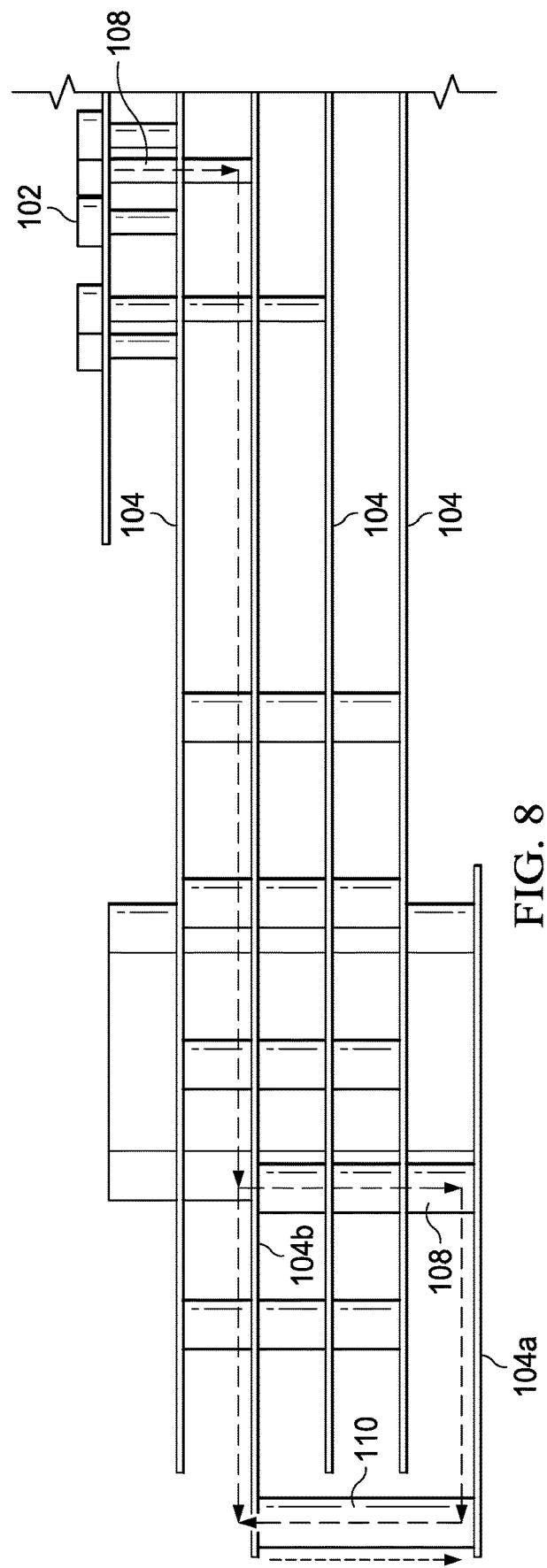

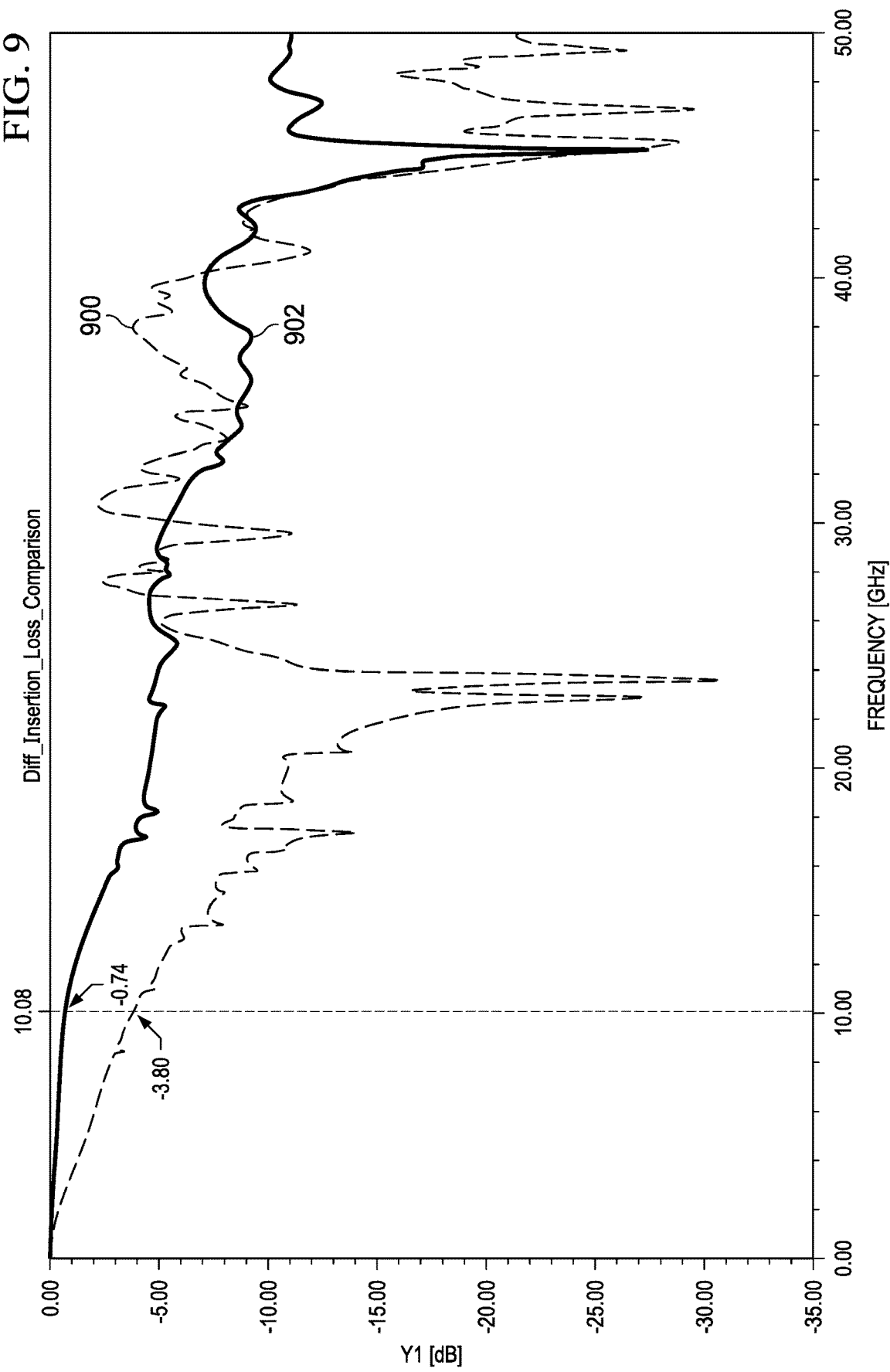

HIGH-FREQUENCY CERAMIC PACKAGES WITH MODIFIED CASTELLATION AND METAL LAYER ARCHITECTURES

BACKGROUND

Semiconductor chips are housed inside packages that protect the chips from deleterious environmental influences, such as heat, moisture, and debris. A packaged chip generally communicates with electronic devices outside the package via conductive members (e.g., leads) that are exposed to surfaces of the package. Some packages include substrates on which the semiconductor die is positioned. The substrate may include multiple metal layers, or traces, that carry electrical signals or power.

SUMMARY

In examples, a semiconductor package comprises a ceramic substrate and a horizontal metal layer covered by the ceramic substrate. The metal layer is configured to carry signals in the 5 GHz to 38 GHz frequency range. The package also includes a vertical castellation on an outer surface of the ceramic substrate, the castellation coupled to the metal layer and having a height ranging from 0.10 mm to 0.65 mm.

In examples, a semiconductor package comprises a ceramic substrate and first and second horizontal metal layers covered by the ceramic substrate and coupled to each other by way of one or more vias. The first and second metal layers are configured to carry signals in the 5 GHz to 38 GHz frequency range. The package also includes a vertical castellation on an outer surface of the ceramic substrate, the castellation coupled to the first metal layer at a first location and to the second metal layer at a second location, the first and second locations separated by a vertical distance that is at least 50 percent of the height of the castellation.

In examples, an electronic device, comprises a printed circuit board (PCB) having a conductive trace, and a semiconductor package coupled to the PCB and to the conductive trace by way of a solder fillet. The semiconductor package includes a ceramic substrate, a semiconductor die, and a horizontal metal layer covered by the ceramic substrate and coupled to the semiconductor die by way of one or more vias. The metal layer is configured to carry signals in the 5 GHz to 38 GHz frequency range. The metal layer is coupled to the solder fillet and not coupled to a vertical castellation.

BRIEF DESCRIPTION OF THE DRAWINGS

For a detailed description of various examples, reference will now be made to the accompanying drawings in which:

FIG. 2 is a diagram of a network of metal layers and vias in a semiconductor package in accordance with various examples.

FIGS. 3A1-3E1 are perspective views of metal layers in a semiconductor package in accordance with various examples, and FIGS. 3A2-3E2 are top-down views of metal layers in a semiconductor package in accordance with various examples.

FIG. 4 is a graph depicting improvements in insertion loss associated with a semiconductor package that is in accordance with various examples.

FIG. 8 is a diagram of a network of metal layers and vias in a semiconductor package in accordance with various examples.

FIG. 9 is a graph depicting improvements in insertion loss associated with a semiconductor package that is in accordance with various examples.

DETAILED DESCRIPTION

Figure 1A:
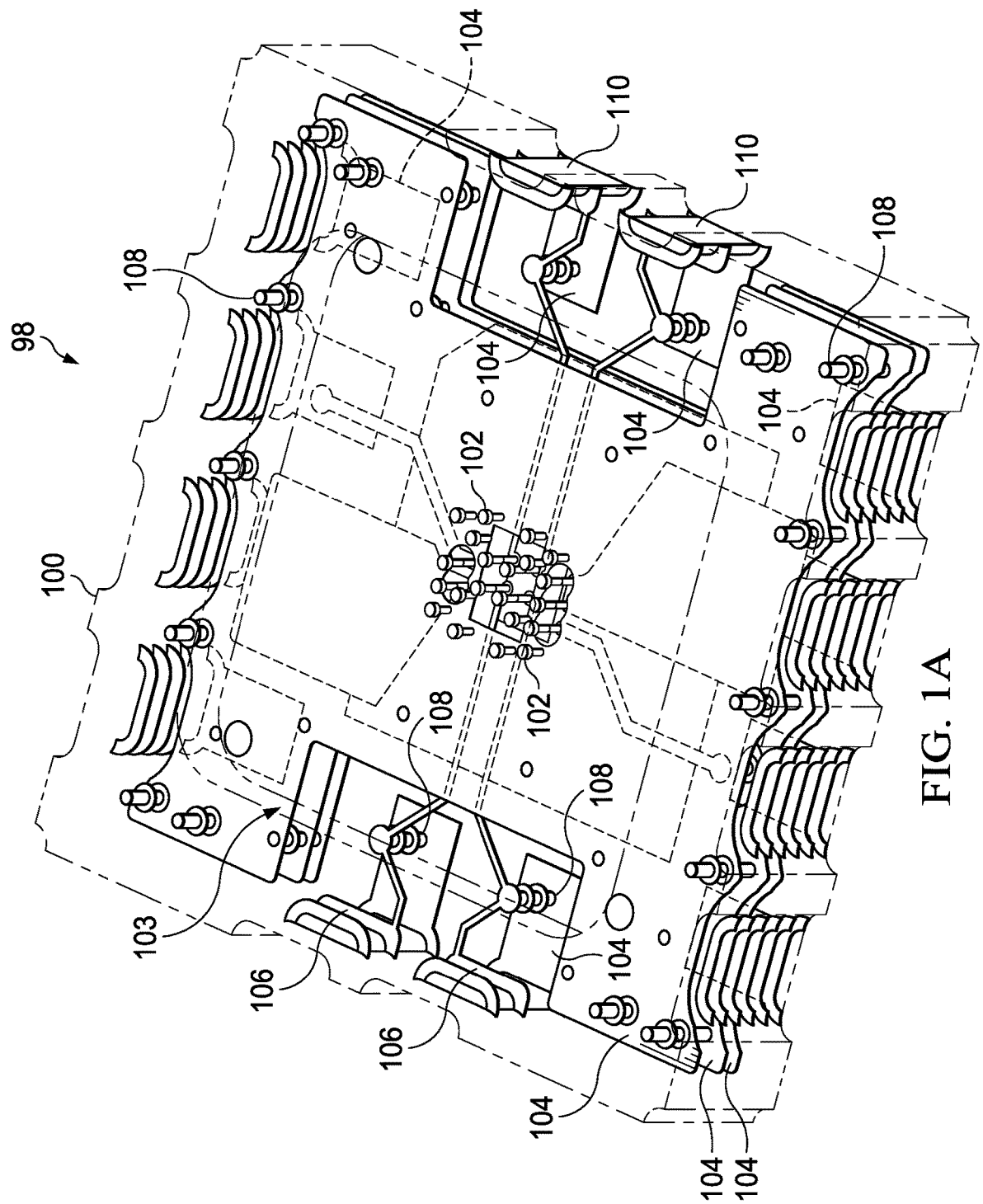
FIGS. 1A-1C are perspective, top-down, and profile views of a semiconductor package in accordance with various examples.

Ceramic semiconductor packages are hermetically sealed packages containing ceramic substrates that cover multiple metal layers. A ceramic substrate in such a package may include a cavity at the top of the package, and a semiconductor die may be positioned on the floor of this cavity. The metal layers of the ceramic substrate may be coupled to each other and to the semiconductor die through a network of metallic vias. One or more of the metal layers may be configured to carry high-frequency signals, such as in the 5 Gigahertz (GHz) to 38 GHz frequency range.

The bottom metal layer in the ceramic substrate is used to couple the network of metal layers, vias, and the semiconductor die within the package to electronic components (e.g., conductive traces on a printed circuit board (PCB)) outside the package. However, the bottom metal layer is thin, so it can be difficult to use solder fillets to couple the bottom metal layer to conductive traces on a PCB. To facilitate the coupling of solder fillets to the bottom metal layer of the package, vertical conductive members, called castellations, are provided on the outer surfaces of the package. A castellation couples to the bottom metal layer and thus provides a larger and more vertical surface area to which the solder fillet may couple. In this way, solder fillets form more mechanically stable connections to the bottom metal layer of the package.

The structural configuration of castellations, however, introduces significant drawbacks. In particular, the thin, horizontal bottom metal layer of the package couples to a vertical castellation, and the vertical castellation and the bottom metal layer together couple to a solder fillet, and the solder fillet, in turn, couples to a conductive trace on a PCB. The resulting structure may broadly be described as a thin conductive base layer and a vertical component (e.g., the castellation and solder fillet) that is coupled to the thin conductive base layer, essentially forming a conductive "T" shape. This structure behaves as a quarter wavelength resonator when carrying signals in the GHz range, meaning that the resonance produced by the structure (and more specifically, by the vertical castellation) significantly attenuates high-frequency signals and causes highly problematic insertion losses in frequency bands of interest (e.g., 20 GHz to 30 GHz). The insertion losses negatively impact package performance significantly.

Disclosed herein are various examples of a ceramic package with modified castellations and/or modified metal layer architectures that mitigate the challenges described above. The ceramic packages described herein make it possible to use castellations (e.g., to provide stable solder fillet connections) in high-frequency applications while simultaneously resolving the quarter wavelength resonance and insertion loss challenges described above. In some examples, a castellation height is reduced relative to castellation heights in other solutions, thereby pushing the resonance frequency beyond the frequency bands of interest and mitigating insertion losses. In some examples, multiple metal layers carrying high-frequency signals are coupled to a castellation, thereby reducing the length of castellation that is able to generate resonant signals. Consequently, the resonance frequency is pushed beyond the frequency bands of interest and insertion losses are mitigated. In some examples, a castellation's height is reduced as described above and multiple metal layers are coupled to the castellation as described above, thereby achieving significant mitigation of insertion losses. In some examples, the castellations are omitted, thus achieving significant mitigation of insertion losses.

FIG. 1A is a perspective view of a semiconductor package 98 in accordance with various examples. In some examples, the package 98 is a ceramic package that includes a ceramic substrate 100. In some examples, the package 98 may be hermetically sealed. In some examples, the package 98 includes multiple conductive contacts 102. The conductive contacts 102 are adapted to be coupled to a semiconductor die (not expressly shown). For example, the conductive contacts 102 may extend through or be exposed to a bottom surface of a cavity 103 in the ceramic substrate 100. A semiconductor die may be positioned in the cavity 103 and coupled to the conductive contacts 102.

Figure 1B:
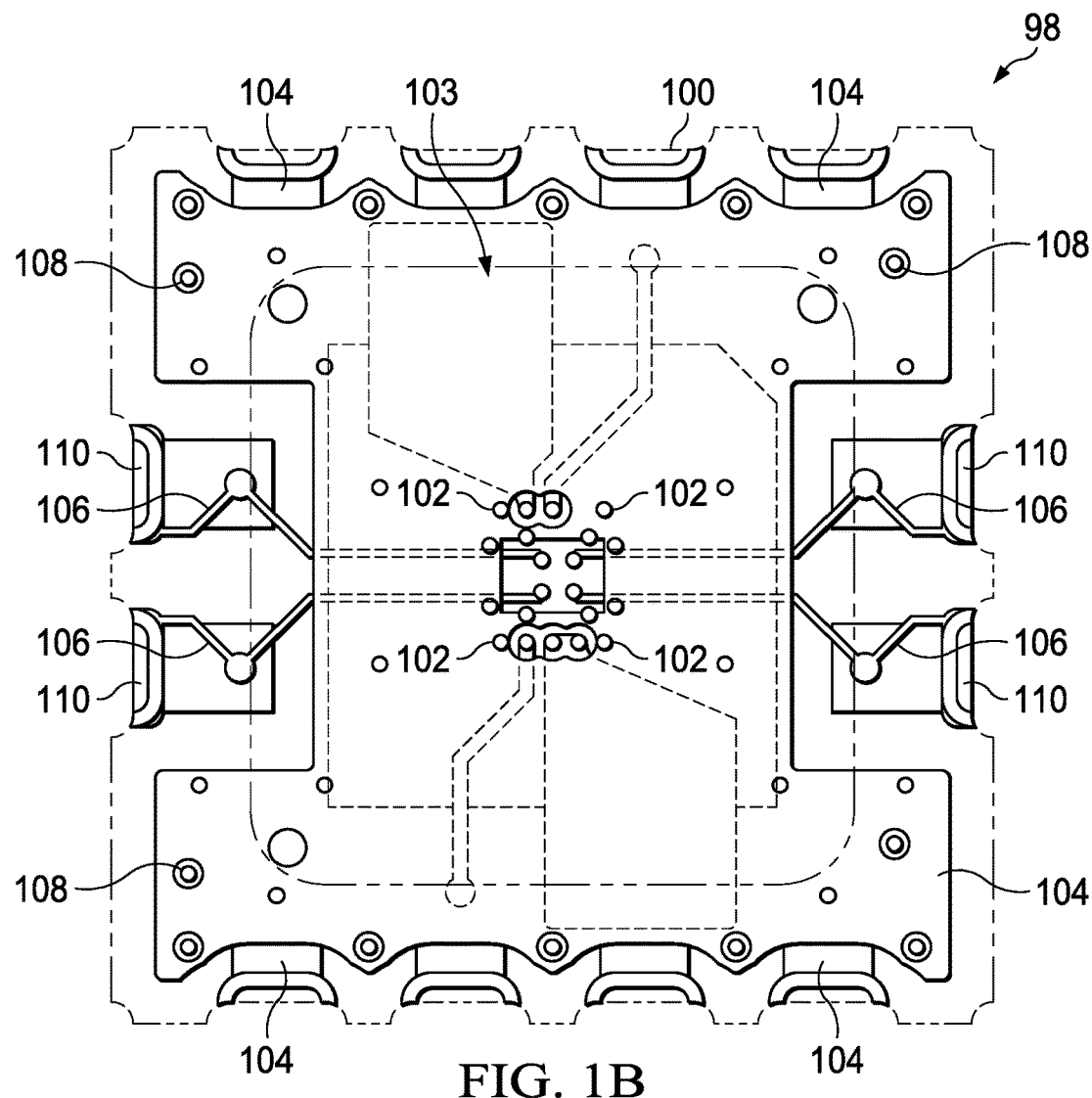
Figure 1C:
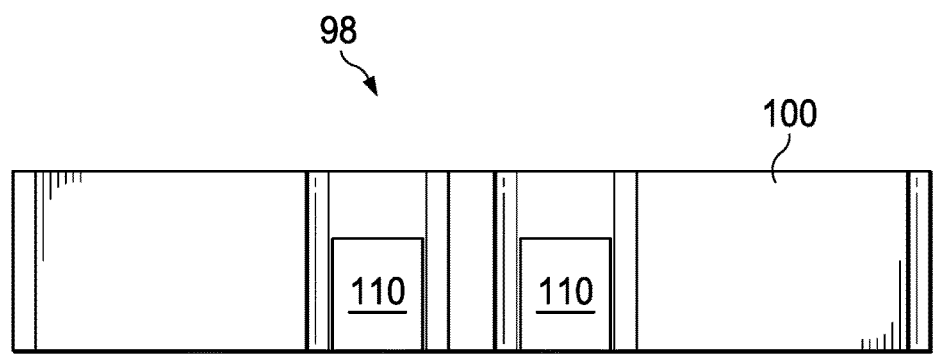

The conductive contacts 102 are coupled to a network of metal layers 104 and vias 108 in the package 98. The specific configuration of the network of metal layers 104 and vias 108 may vary depending on the application. The vias 108 couple different metal layers 104 to each other, and at least some of the metal layers 104 terminate at conductive members, such as vertical castellations 110, that are exposed to an exterior of the package 98. In this way, a semiconductor die in the package 98 is able to communicate and/or receive power from electronic devices outside of the package 98. The metal layers 104 may have differing configurations and may be positioned in different horizontal planes relative to one another. At least some of the metal layers 104 are configured to carry high-frequency signals, such as in the 5 GHz to 38 GHz range. The metal layers 104 may include conductive traces, such as conductive traces 106, that are configured to carry high-frequency signals. Although enumerated using a numeral 106, the conductive traces 106 are instances of, or parts of, metal layers 104. The conductive traces 106 couple to the conductive contacts 102, or, alternatively, the conductive traces 106 couple to other conductive members (e.g., vias 108) that couple to the conductive contacts 102. The conductive traces 106, like other metal layers 104, may terminate at the castellations 110. In some examples, only one metal layer 104 (e.g., the bottom-most metal layer among the metal layers 104) couples to a castellation 110. In some examples, two metal layers 104 couple to a castellation 110. In some examples, three or more metal layers 104 couple to a castellation 110. In the example of FIGS. 1A-1C, the bottom-most metal layer 104 and the conductive traces 106 couple to the castellations 110, and the remainder of the metal layers 104 do not couple to the castellations 110.

As described above, in other solutions, a vertical castellation can generate the undesirable resonance of high-frequency signals in a frequency band of interest (e.g., a frequency band that is intended to be used in a particular application). Accordingly, in some examples, multiple metal layers may be coupled to a castellation, thereby reducing the length of the castellation in which resonant signals may be generated. Because the length of the castellation in which resonant signals can be generated is reduced, the resonant frequency is increased and is pushed beyond the frequency range of interest. For example, as shown in FIG. 1A, the bottom-most metal layer 104 and the conductive traces 106 are coupled to the castellations 110, and the remaining metal layers 104 are not coupled to the castellations 110. Because multiple metal layers 104 (including the conductive traces 106) are coupled to the castellations 110, the portion of each castellation 110 that is between the point of contact with the metal layers 104 does not generate resonance. Instead, only the portion of each castellation 110 that extends above the metal layer 104 that is most distal from the bottom-most metal layer 104 generates resonance. The length of the portion of the castellation 110 that generates resonance is significant because it determines the resonant frequency per expression (1):

$$L = \frac{\lambda}{4} = \frac{c}{4 f_{res} \sqrt{\varepsilon}} \quad (1)$$

where L is the length of the portion of the castellation 110 that generates resonance, $\lambda$ is the wavelength of the signal in the castellation 110, c is the speed of light in a vacuum, $f_{res}$ is the resonant frequency generated by the castellation 110, and $\varepsilon$ is the dielectric constant of the ceramic material that encloses the metal layers. In examples including multiple metal layers 104 coupling to a castellation 110 (such as the bottom-most metal layer 104 and a conductive trace 106), L is reduced and equals the length of the castellation 110 extending beyond the top-most metal layer 104 that couples to the castellation 110. When L is reduced, $f_{res}$ increases. Accordingly, L can be controlled to produce a $f_{res}$ that is beyond the frequency band of interest. When $f_{res}$ is beyond the frequency band of interest, insertion losses are also beyond the frequency band of interest, thereby significantly improving insertion losses in the frequency band of interest. FIG. 1B is a top-down view of the structure of FIG. 1A, and FIG. 1C is a profile view of the structure of FIG. 1A.

FIG. 2 is a simplified schematic diagram of the network of metal layers and vias in the ceramic substrate 100. In particular, FIG. 2 shows conductive contacts 102, vias 108 coupled to the conductive contacts 102, metal layers 104 coupled to the various vias 108, and a castellation 110. The metal layers 104 include metal layers 104a and 104b, which are in different horizontal planes. Metal layer 104a is the bottom-most metal layer 104 in the ceramic substrate 100, and metal layer 104b is neither the top-most nor the bottom-most metal layer 104 in the ceramic substrate 100 (although in some examples, the metal layer 104b may be the top-most metal layer 104 in the ceramic substrate 100). The metal layer 104b includes the conductive traces 106 (FIG. 1A). Both the metal layers 104a, 104b are coupled to the castellation 110. The remaining metal layers 104 are not coupled to the castellation 110, although in some examples, additional metal layers 104 may be coupled to the castellation 110.

In operation, and as indicated by the arrows shown in FIG. 2, a semiconductor die coupled to the conductive contacts 102 provides high-frequency signals (e.g., 5 GHz to 38 GHz) to vias 108, which, in turn, provide the signals to the metal layer 104b. Vias 108 provide the signals to the metal layer 104a. Metal layers 104a and 104b provide the high-frequency signals to the castellation 110. The segment of the castellation 110 between the metal layers 104a and 104b does not generate resonant signals, but the segment of the castellation 110 that extends above the metal layer 104b does generate resonant signals. However, the coupling of the metal layer 104b to the castellation 110 reduces the portion of the castellation 110 that would resonate from the entire castellation 110 to only the segment of the castellation 110 that extends above the metal layer 104b. Thus, the quantity L in expression (1) above is reduced, and thus $f_{res}$ in expression (1) is increased. The specific location at which the metal layer 104b couples to the castellation 110 may be adjusted to result in a value of L that produces a value of $f_{res}$ that is outside the frequency band of interest.

The distance between the locations at which metal layers 104a and 104b contact the castellation 110 may vary, but will be at least 50% of the total height of the castellation 110. A distance falling below this range is disadvantageous at least because it results in an unacceptably low resonant frequency in the frequency band of interest and thus unacceptable insertion losses in the frequency band of interest. In some examples, this distance is 100% of the total height of the castellation 110 to achieve optimal insertion loss mitigation.

FIGS. 3A1-3E1 are perspective views of metal layers in a semiconductor package in accordance with various examples, and FIGS. 3A2-3E2 are top-down views of metal layers in a semiconductor package in accordance with various examples. Each pair of drawings (e.g., 3A1 and 3A2; 3B1 and 3B2, etc.) depicts different structures that may be used as part of conductive traces 106, and more specifically, the portion of conductive traces 106 that couple to castellations 110 and to the vias 108 most proximal to the castellations 110, as shown.

FIG. 4 is a graph depicting improvements in insertion loss associated with the package 98. Curve 400 depicts insertion losses as a function of the frequency of signals carried through the network of metal layers and vias in a conventional package. As shown, insertion losses are significant in the 20 GHz to 30 GHz range, which is the frequency range at which the castellation of the conventional package resonates. The insertion losses in the range of 45 GHz and beyond are irrelevant as they are outside the frequency band of interest (e.g., 5 GHz to 38 GHz). Curve 402 depicts insertion losses as a function of the frequency of signals carried through the network of metal layers and vias in the package 98. As shown, the insertion losses are still present, but they have been pushed to the highest end, and beyond the highest end, of the frequency band of interest (e.g., 5 GHz to 38 GHz). Within the frequency band of interest, such as from 5 GHz to 38 GHz, insertion losses are generally superior in the package 98 relative to insertion losses in a conventional package.

As described above, the length of the segment of a castellation 110 that produces resonant signals determines the resonant frequency. Thus, reducing the length of this segment L (expression (1) above) by coupling another metal layer 104 to the castellation 110 increases the resonant frequency $f_{res}$ to a range that is outside the frequency band of interest. In some examples, however, this principle is leveraged in a different way. Specifically, instead of coupling another metal layer 104 to the castellation 110 to reduce L as described above, in some examples, L may be reduced by reducing the height of the castellation 110. In such examples, a single metal layer 104 (e.g., the bottom-most metal layer 104, such as metal layer 104a in FIG. 2) is coupled to the castellation 110, but the castellation 110 height is reduced, thereby reducing L in expression (1) and realizing the improvements in insertion losses in the frequency band of interest as described above.

Figure 5A:
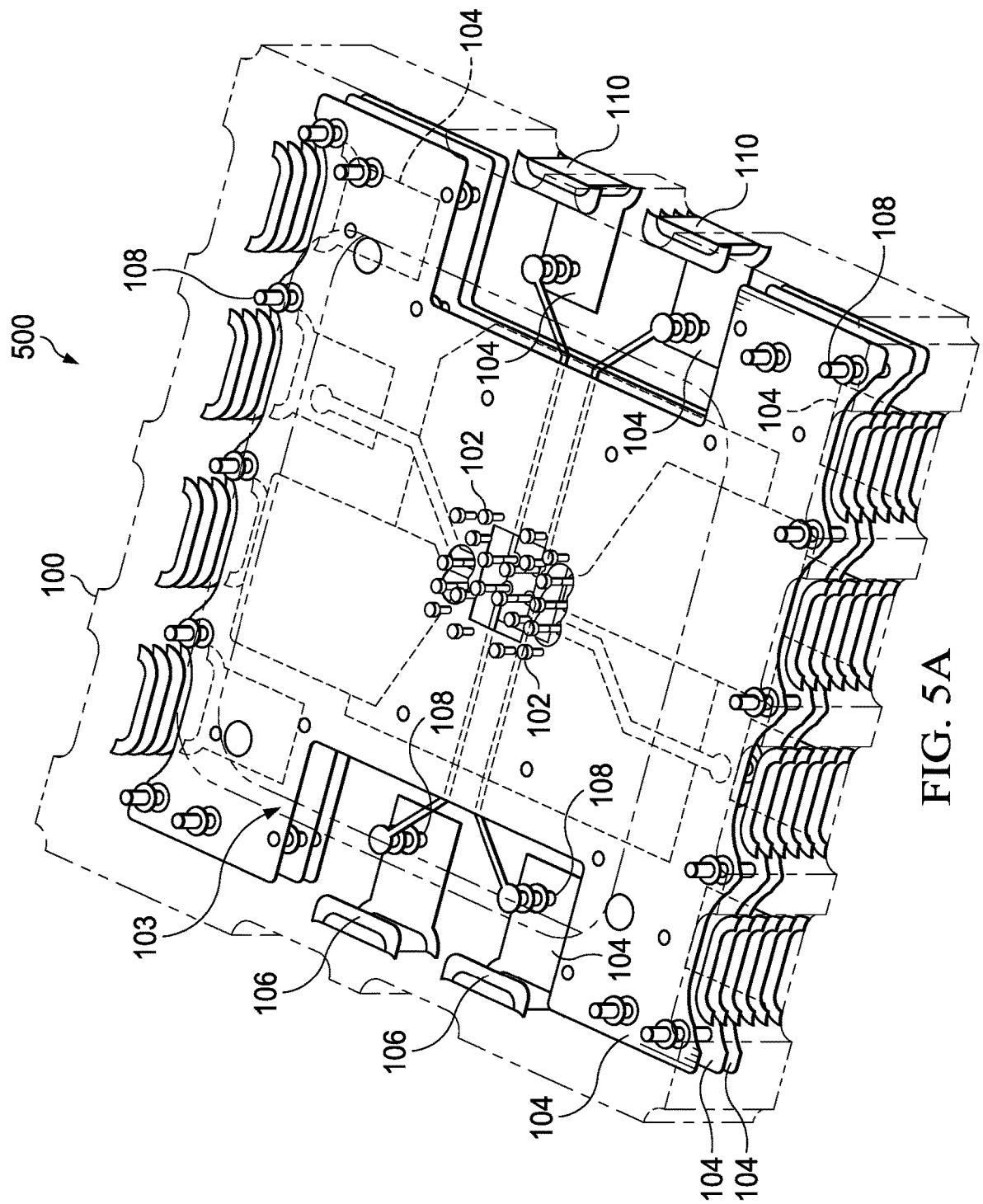
FIGS. 5A-5C are perspective, top-down, and profile views of a semiconductor package in accordance with various examples.
Figure 5B:
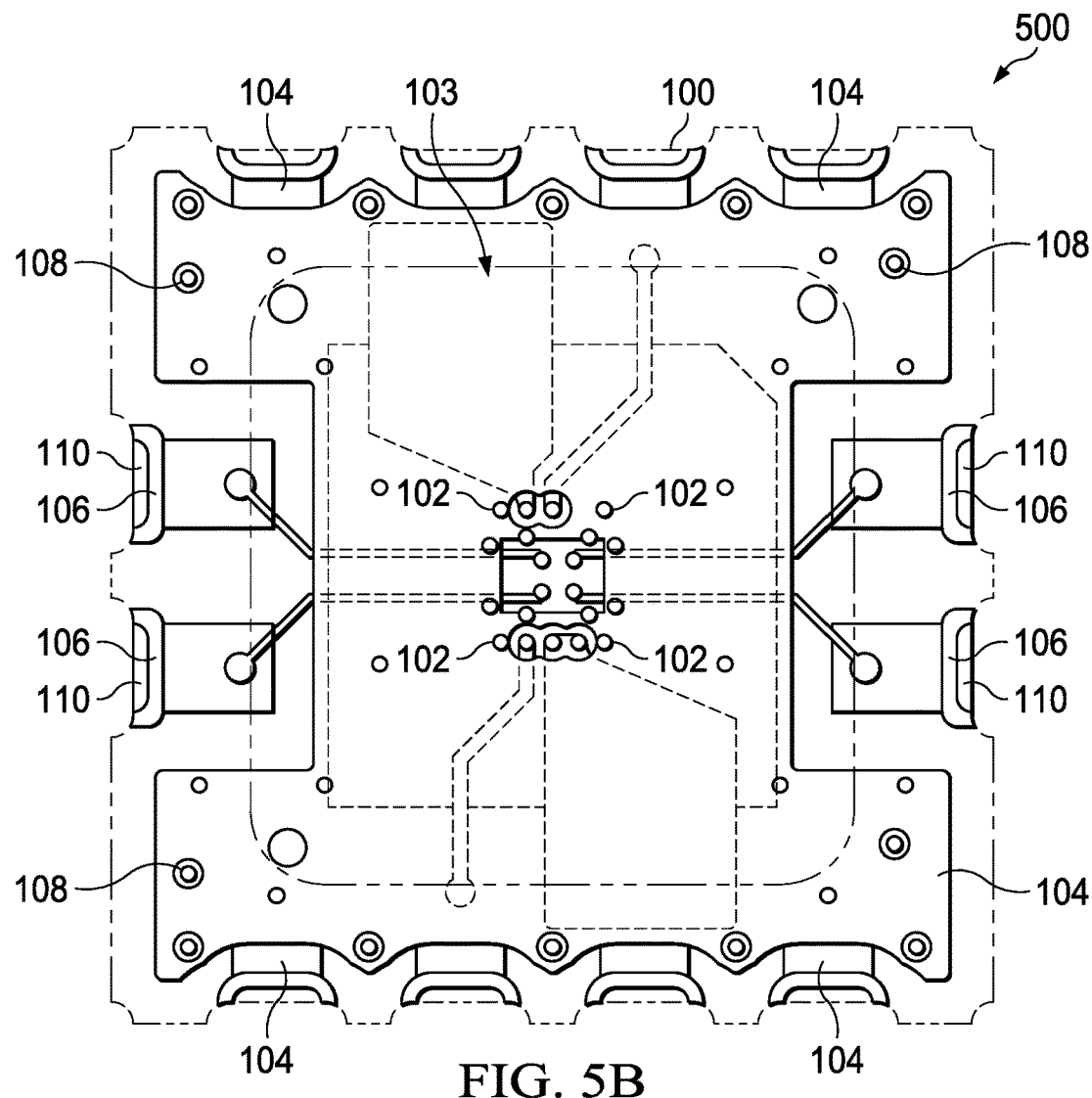
Figure 5C:
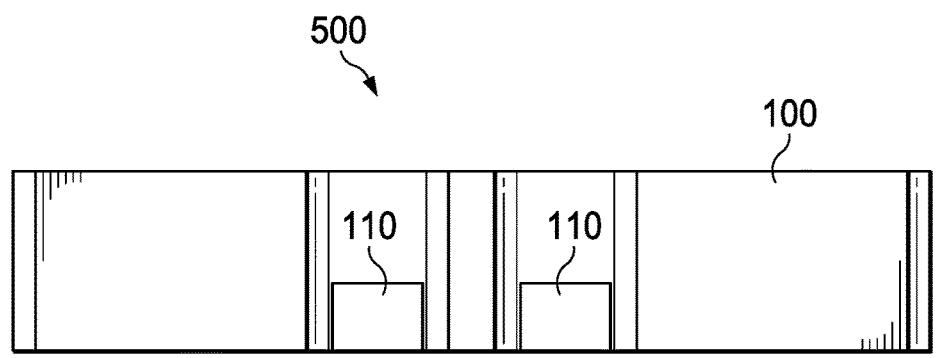
Figure 6:
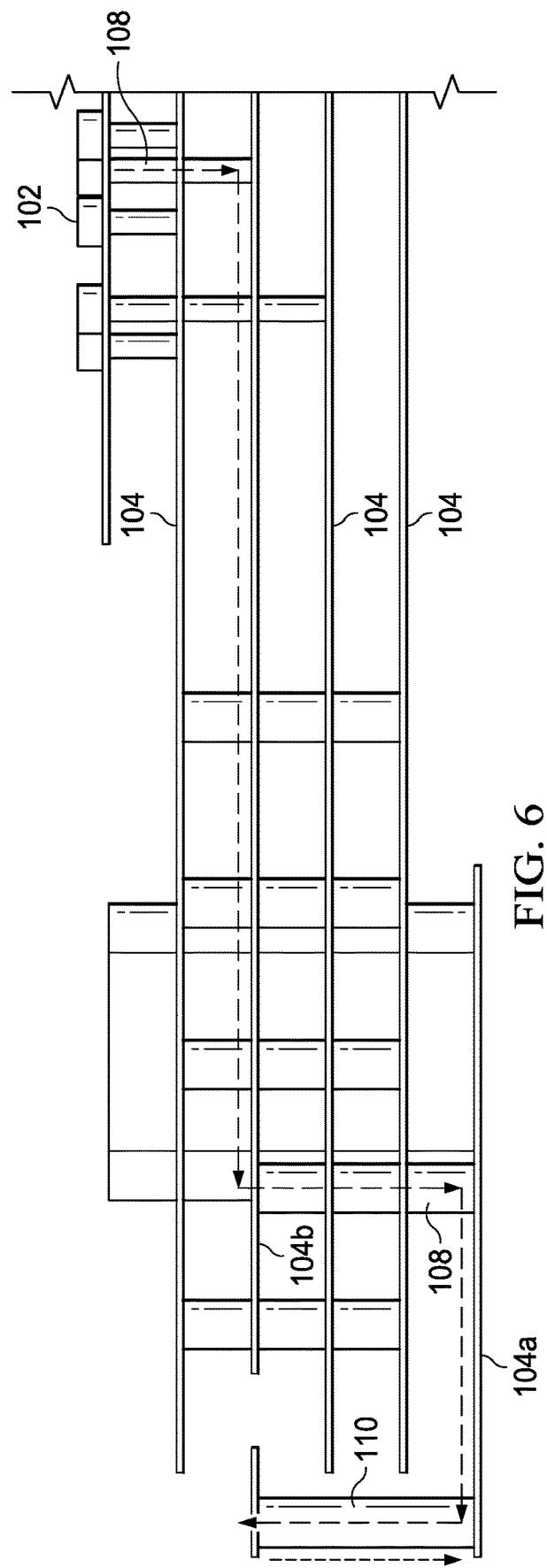
FIG. 6 is a diagram of a network of metal layers and vias in a semiconductor package in accordance with various examples.

FIG. 5A is a perspective view of a semiconductor package 500 in accordance with various examples. Package 500 is similar, but not identical, to package 98 described above, with like numerals referring to like components, with the exceptions described below. In FIG. 5A, only the bottom-most metal layer 104 is coupled to the castellation 110. However, the height of the castellation 110 is reduced relative to castellation heights used in other solutions. The height of a castellation 110 ranges from 0.10 mm to 0.65 mm as measured from a bottom surface of the ceramic substrate 100, with a height greater than this range resulting in an unacceptably high degree of resonance and insertion losses, and with a height lower than this range resulting in solder fillets having heights that produce unacceptably low levels of mechanical stability, as solder fillets are used to couple the castellations 110 to a PCB. FIG. 5B is a top-down view of the structure of FIG. 5A, and FIG. 5C is a profile view of the structure of FIG. 5A. FIG. 6 is a diagram of a network of metal layers and vias in a semiconductor package in accordance with various examples. As FIG. 6 shows, the total height of the castellation 110 is reduced compared to other solutions in which the castellation 110 typically extends along the full height of the ceramic substrate 100. The height of the castellation 110 is within the range provided above. Furthermore, the only metal layer 104 to make contact with the castellation 110 is the bottom-most metal layer 104, as shown, although in some examples, a different metal layer 104 may contact the castellation 110. Because the height of the castellation 110 is reduced, L (expression (1) above) is reduced, thereby increasing the resonant frequency $F_{res}$ (expression (1) above) and mitigating the insertion loss challenges described above.

Figure 7A:
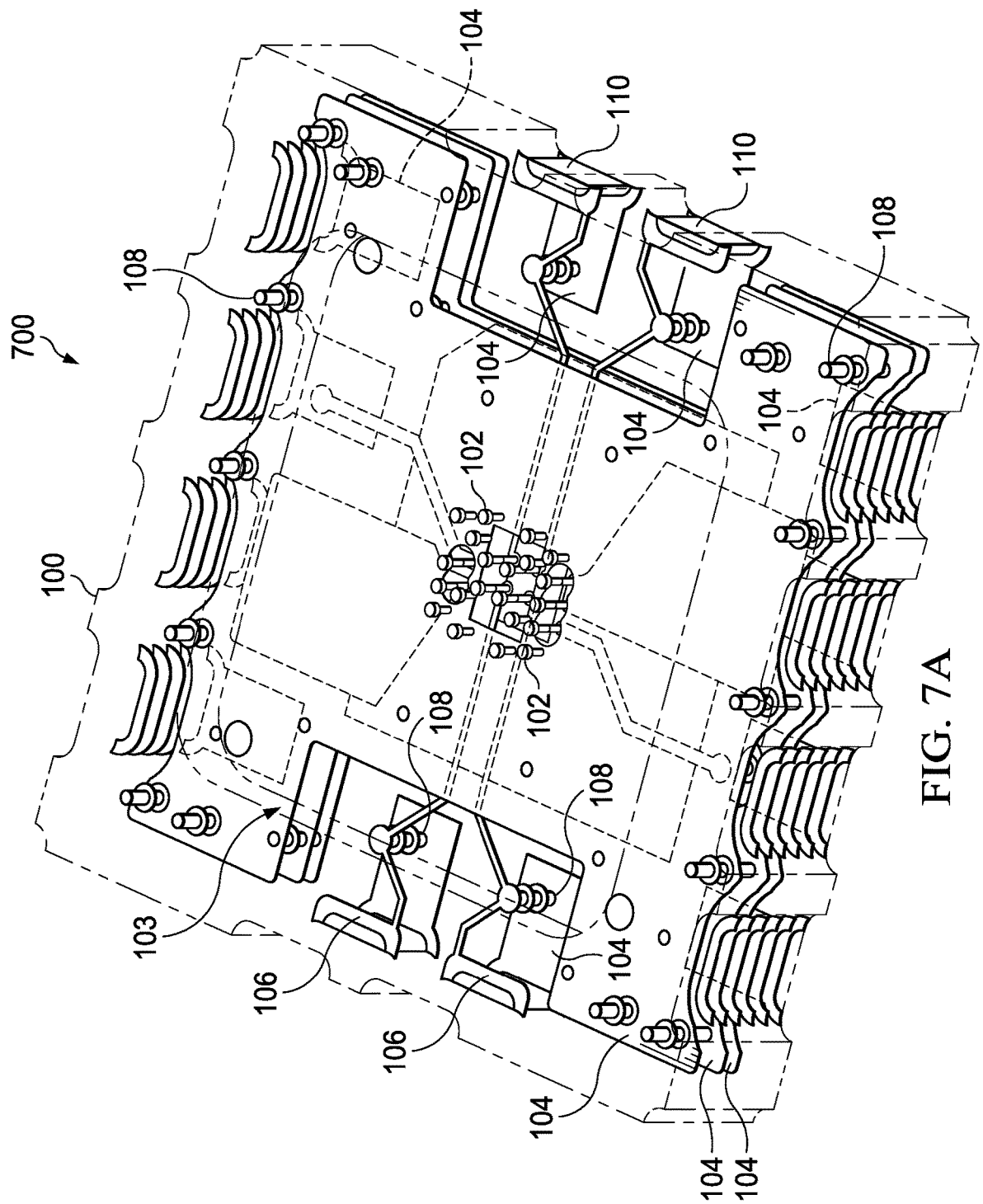
FIGS. 7A-7C are perspective, top-down, and profile views of a semiconductor package in accordance with various examples.
Figure 7B:
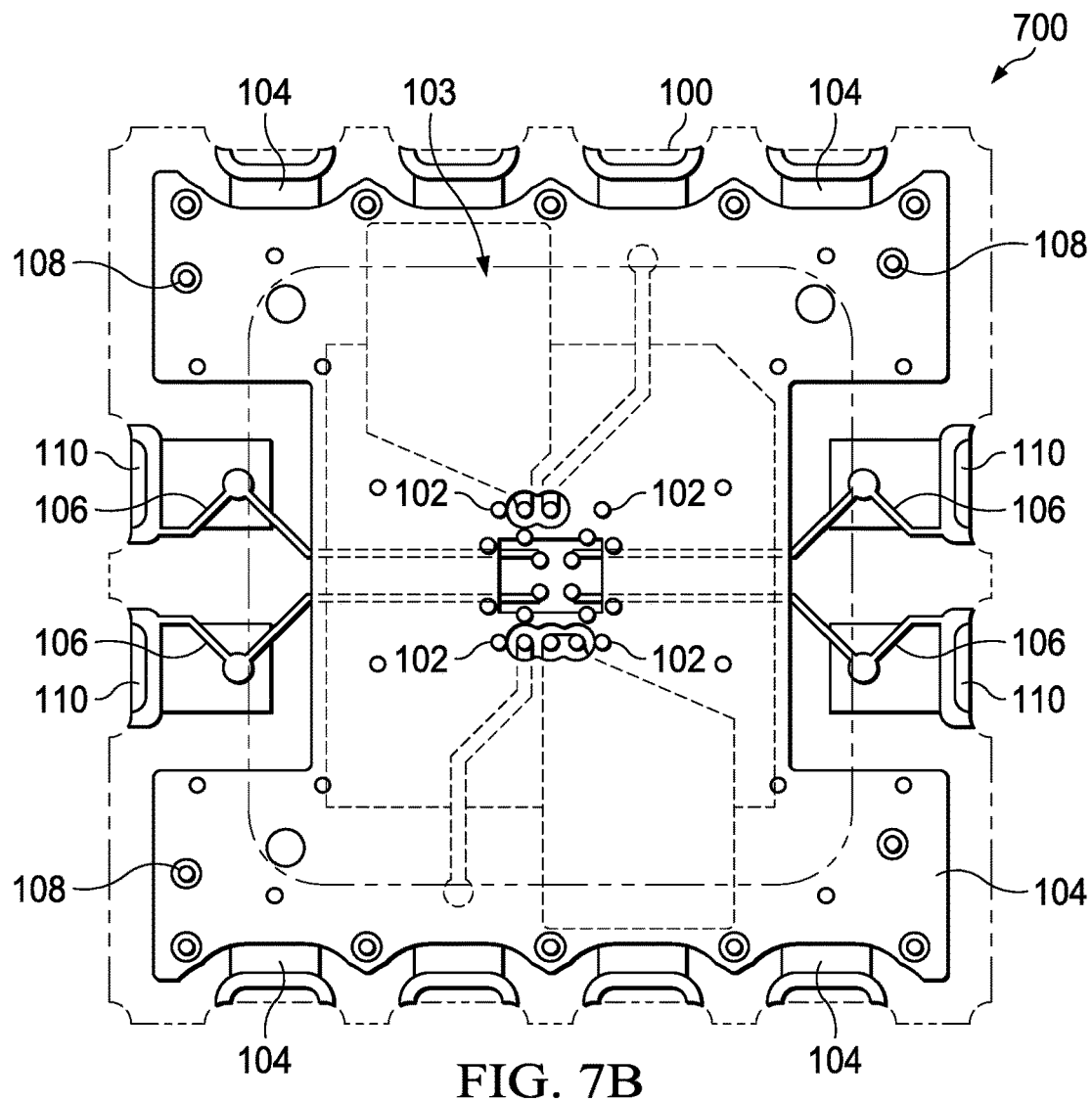
Figure 7C:
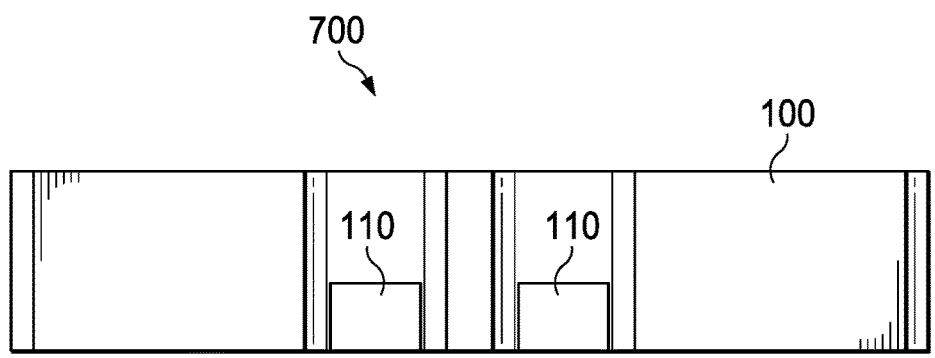

The castellation height reduction of package 500 and the multiple metal layer-to-castellation contacts of package 98 may be combined to mitigate the insertion losses described above. These insertion losses are mitigated because the distance L in expression (1) is reduced relative to other, prior solutions. FIG. 7A is a perspective view of a semiconductor package 700 in accordance with various examples. Package 700 is similar, but not identical, to packages 98 and 500 described above, with like numerals referring to like components, with the exceptions described below. In package 700, the heights of the castellations 110 are reduced as in package 500 (FIGS. 5A-5C and 6), and there are multiple metal layers 104 that make contact with the castellations 110 as in package 98 (FIGS. 1A-1C and 2). FIG. 7B is a top-down view of the structure of FIG. 7A, FIG. 7C is a profile view of the structure of FIG. 7A, and FIG. 8 is a schematic diagram of the network of metal layers and vias in the package 700. In package 700, the castellation 110 height ranges from 0.10 mm to 0.65 mm, with castellation heights outside this range having the disadvantages described above. Further, the distance between the points at which the metal layers 104a and 104b contact the castellation 110 (FIG. 8) may vary, but will be at least 50% of the total height of the castellation 110. A distance falling below this range is disadvantageous at least because it results in an unacceptably low resonant frequency in the frequency band of interest and thus unacceptable insertion losses in the frequency band of interest. In some examples, this distance is 100% of the total height of the castellation 110 to achieve optimal insertion loss mitigation.

FIG. 9 is a graph depicting improvements in insertion loss associated with semiconductor package 700, in accordance with various examples. Curve 900 depicts insertion losses as a function of operating frequency in prior solutions, and curve 902 depicts insertion losses as a function of operating frequency in the package 700. As shown, both curves 900, 902 demonstrate insertion losses, but the insertion losses in curve 902 are outside of the frequency band of interest (e.g., 5 GHz to 38 GHz). Within the frequency band of interest (e.g., 5 GHz to 38 GHz), insertion losses are generally superior for the curve 902 than for the curve 900.

Figure 10:
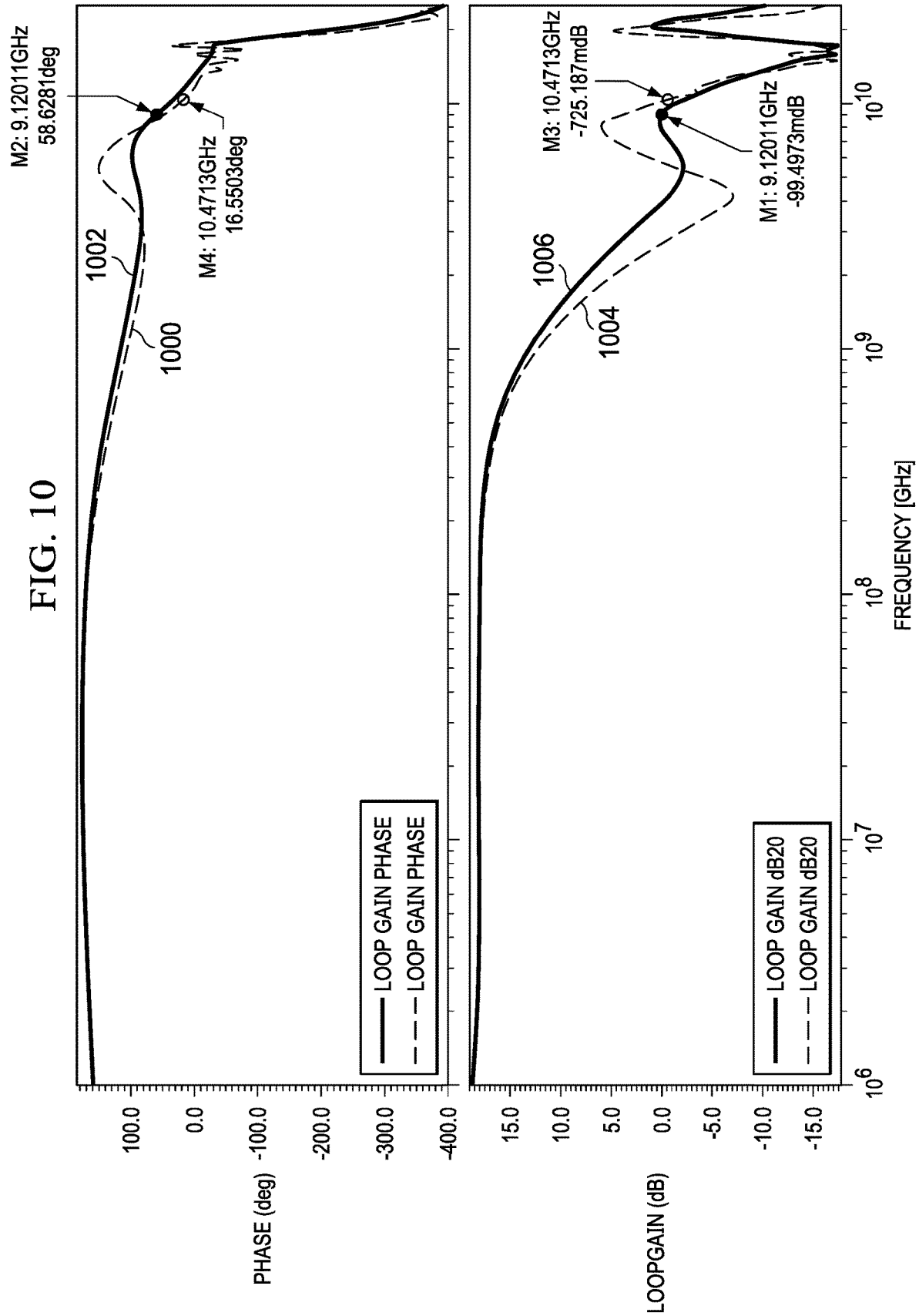
FIG. 10 is a graph depicting phase variation improvements associated with a semiconductor package that is in accordance with various examples.
Figure 11:
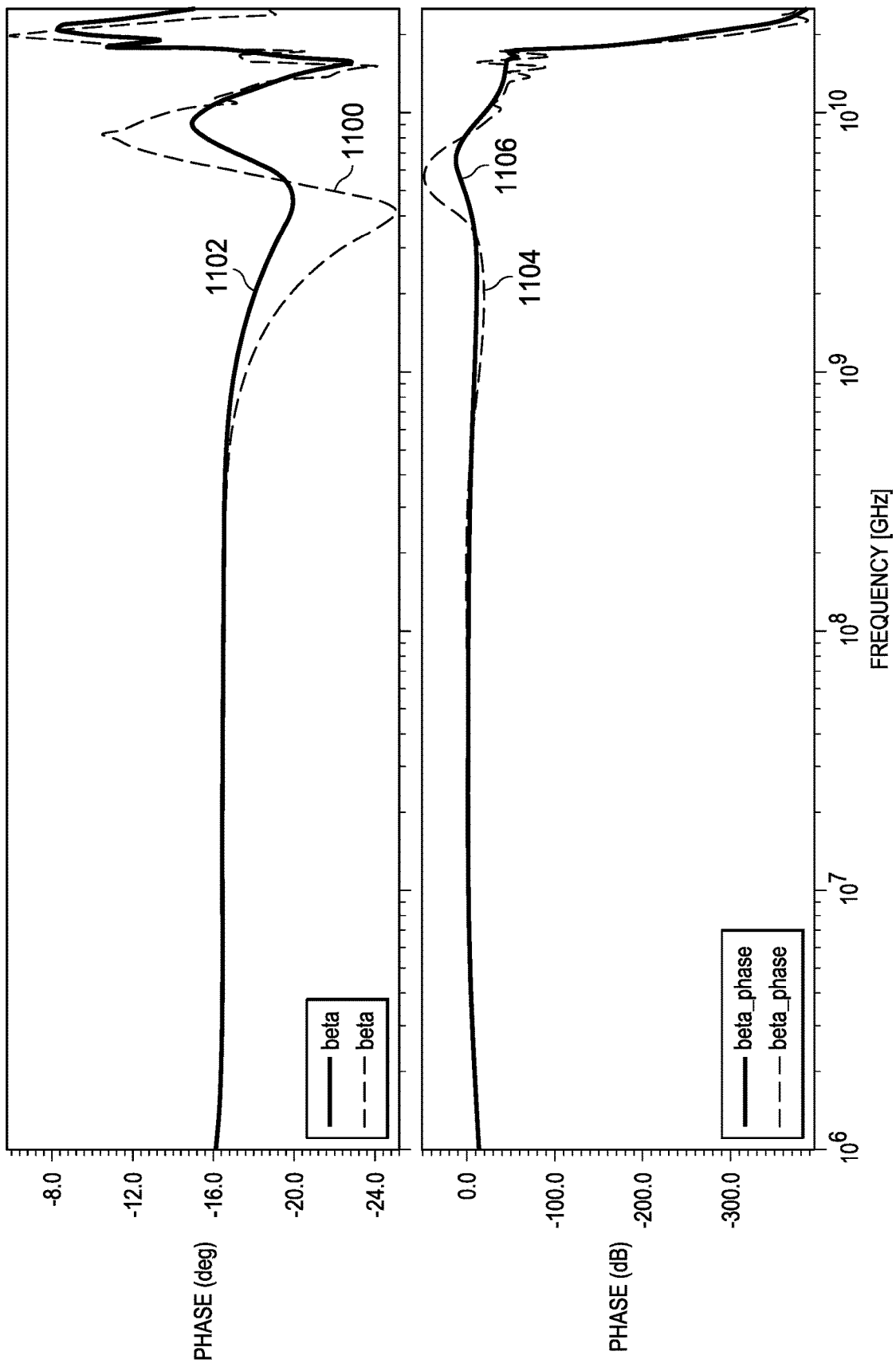
FIG. 11 is a graph depicting phase and magnitude improvements associated with a semiconductor package that is in accordance with various examples.
Figure 12:
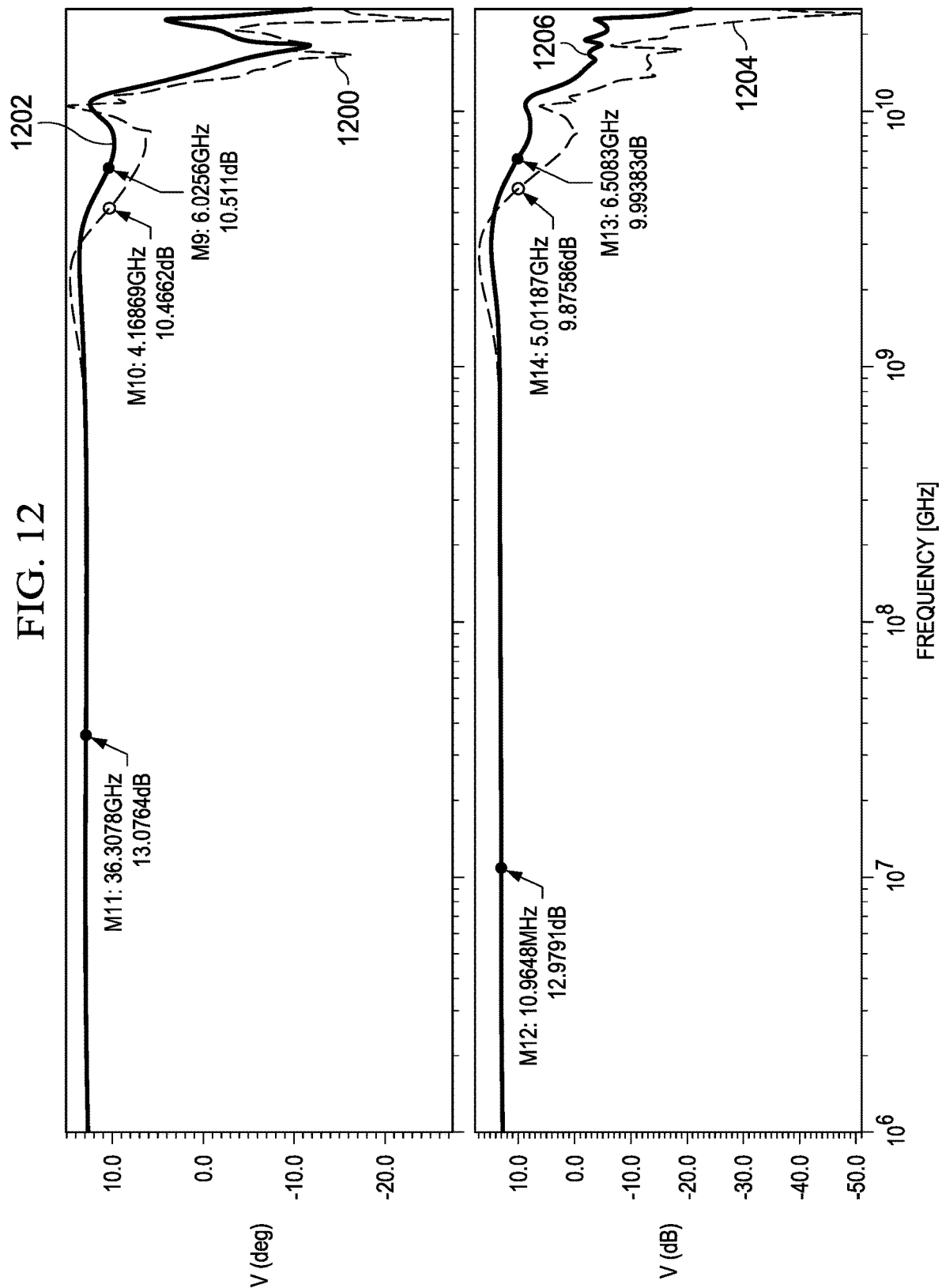
FIG. 12 is a graph depicting peaking and loss improvements associated with a semiconductor package that is in accordance with various examples.

FIG. 10 is a graph depicting phase variation improvements associated with a semiconductor package that is in accordance with various examples. FIG. 11 is a graph depicting phase and magnitude improvements associated with a semiconductor package that is in accordance with various examples. FIG. 12 is a graph depicting peaking and loss improvements associated with a semiconductor package that is in accordance with various examples. In particular, the graph of FIG. 10 includes a top plot and a bottom plot. The top plot demonstrates the phase behavior in degrees as a function of frequency in Hertz (Hz). The bottom plot demonstrates loop gain in decibels (dB) as a function of frequency in Hz. Curves 1000 and 1004 demonstrate the behavior of other solutions, and curves 1002 and 1006 demonstrate the behavior of packages in accordance with various examples of this disclosure. Curve 1000 demonstrates significant phase variation, while curve 1002 demonstrates greater phase stability. This increase in phase stability occurs because there is no resonance observed in-band from the package parasitics, resulting in improved package insertion losses and return losses. Curve 1004 demonstrates less ringing, while curve 1006 demonstrates greater ringing.

The graph of FIG. 11 includes a top plot and a bottom plot. The bottom plot demonstrates the phase behavior in degrees as a function of frequency in Hertz (Hz). The top plot demonstrates loop gain in decibels (dB) as a function of frequency in Hz. Curves 1100 and 1104 demonstrate the behavior of other solutions, and curves 1102 and 1106 demonstrate the behavior of packages in accordance with various examples of this disclosure. Curve 1104 demonstrates significant phase variation, while curve 1106 demonstrates greater phase stability. This increase in phase stability occurs because there is no resonance observed in-band from the package parasitics. Curve 1100 demonstrates more ringing, indicating worse stability, while curve 1102 demonstrates less ringing, indicating superior stability.

The graph of FIG. 12 includes a top plot and a bottom plot. The top plot demonstrates chip and package amplification gain on the y-axis in dB as a function of frequency in Hz, and the bottom plot demonstrates chip, package and PCB amplification gain on the y-axis in dB as a function of frequency in Hz. Curves 1200 and 1204 demonstrate the behavior of other solutions, and curves 1202 and 1206 demonstrate the behavior of packages in accordance with various examples of this disclosure. Curve 1200 demonstrates better ringing and worse amplification performance because of the resonance caused by package castellation, while curve 1202 demonstrates less ringing and improved amplification performance because the resonance is reduced or eliminated by using the structures described herein. Curve 1204 demonstrates greater ringing and worse amplification performance because of the resonance caused by package castellations, while curve 1206 demonstrates less ringing and improved amplification performance because the resonance is mitigated using the structures described herein.

Figure 13A:
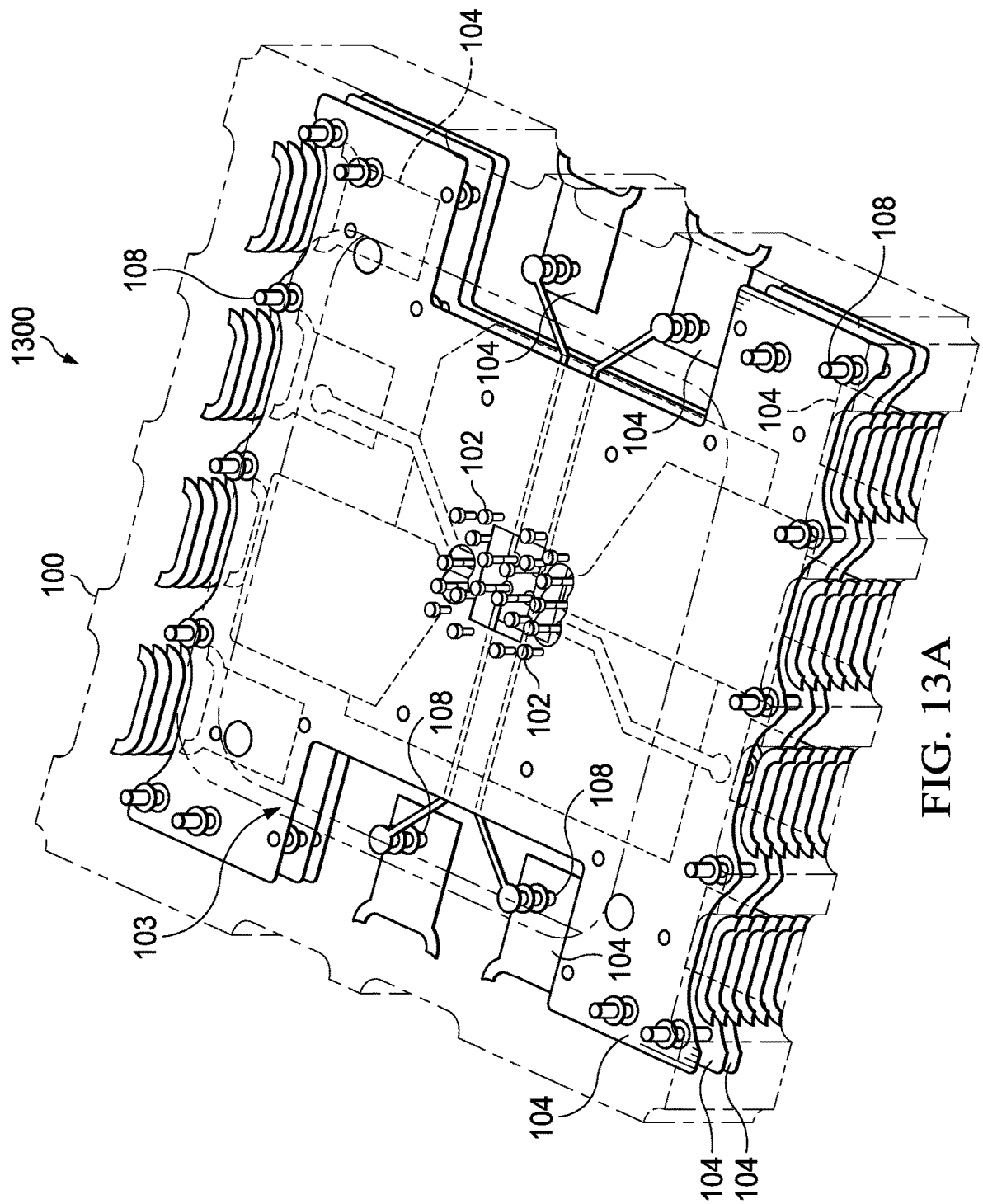
FIGS. 13A-13C are perspective, top-down, and profile views of a semiconductor package in accordance with various examples.
Figure 13B:
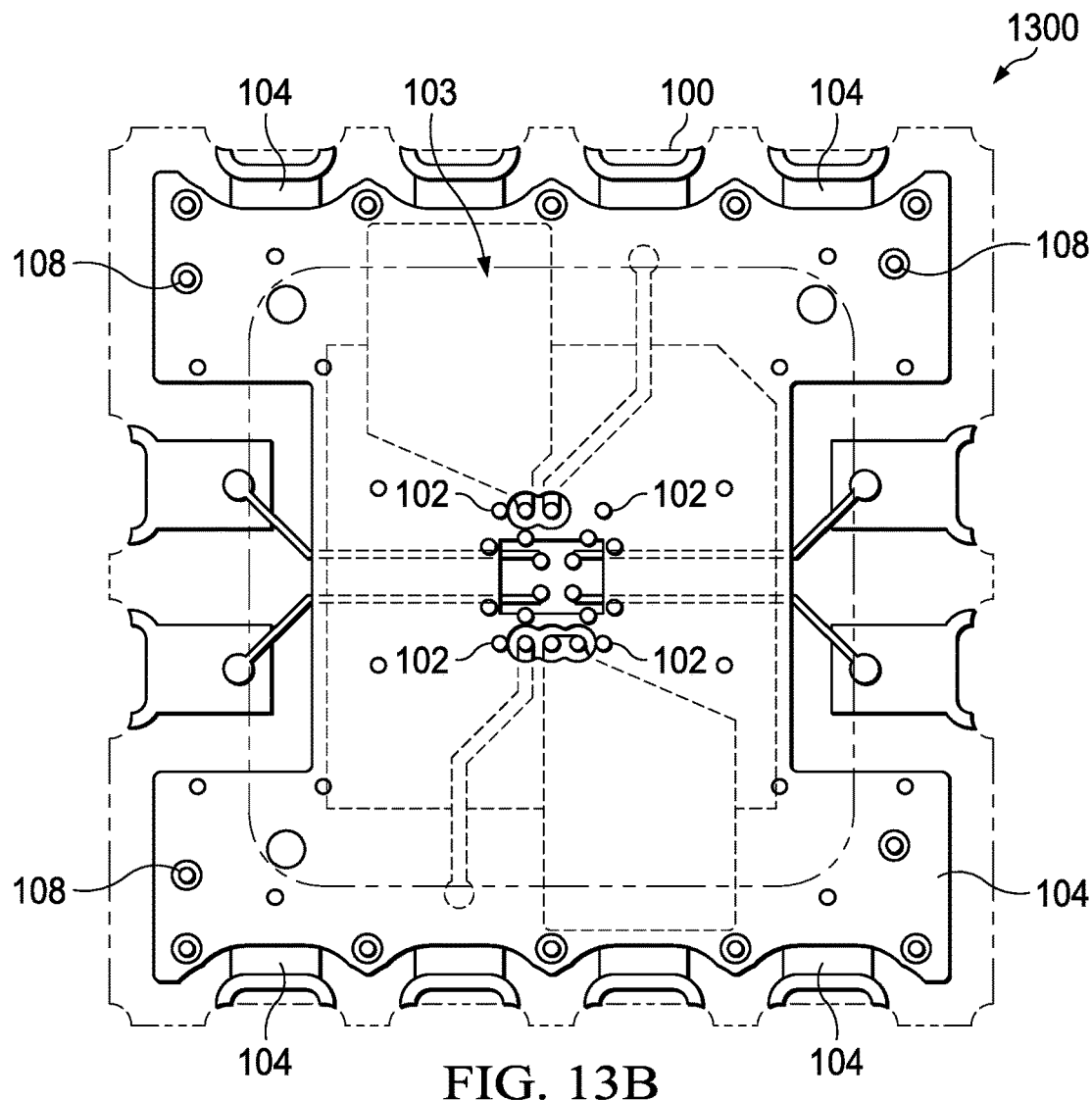
Figure 13C:
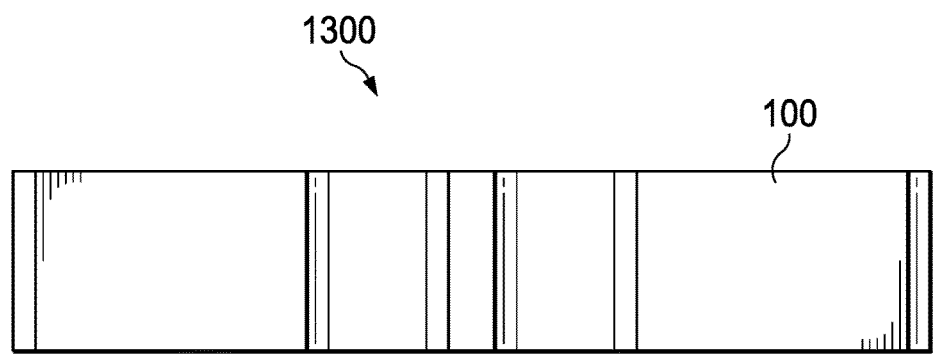
Figure 14:
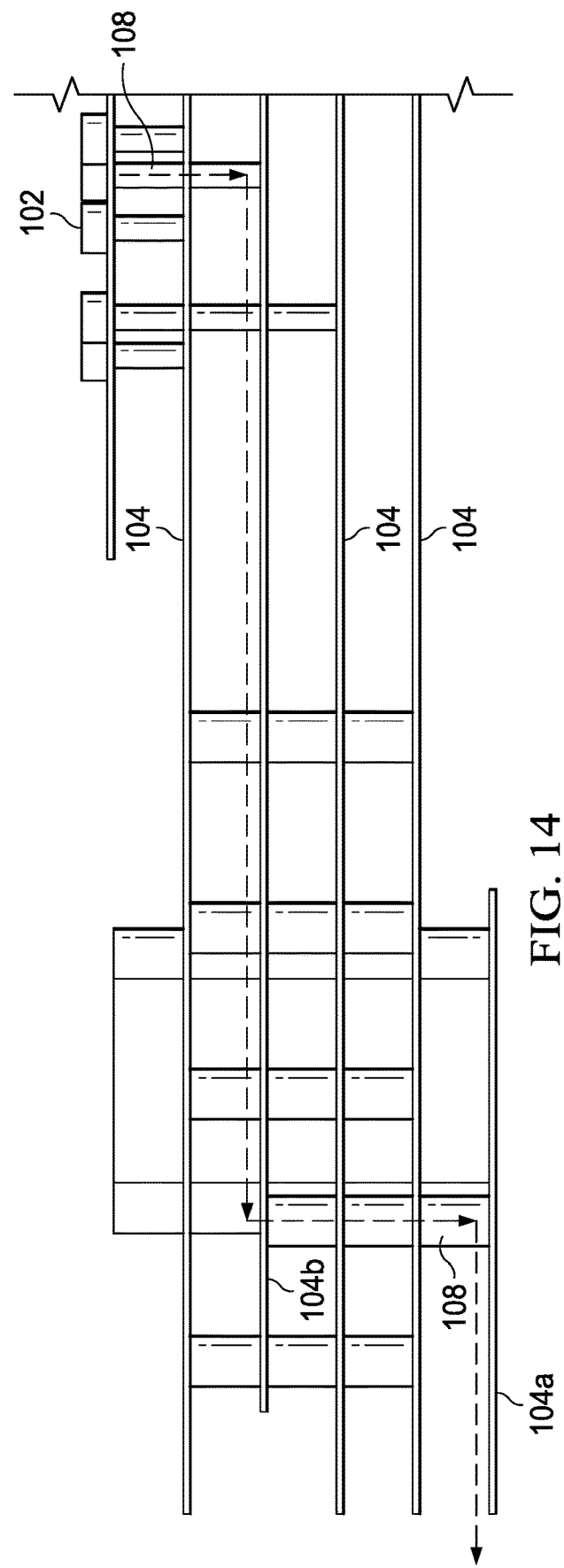
FIG. 14 is a diagram of a network of metal layers and vias in a semiconductor package in accordance with various examples.

In some examples, one or more castellations may be omitted so as to eliminate castellation-related resonance. In such examples, solder fillets on a PCB are coupled directly to one or more metal layers (e.g., the bottom-most metal layer in the package). FIG. 13A is a perspective view of a semiconductor package 1300 in accordance with examples. As shown, castellations are omitted from the package 1300. Consequently, the resonance and attendant insertion losses described above as being generated by castellations 110 are absent from the package 1300, thus significantly improving insertion loss performance. FIG. 13B is a top-down view of the package 1300, and FIG. 13C is a profile view of the package 1300. FIG. 14 is a schematic diagram of a network of metal layers and vias in a semiconductor package in accordance with various examples. As shown, the lack of a castellation results in no castellation-induced resonance. The bottom-most metal layer 104a may couple directly with a solder fillet on a PCB and not to a castellation.

Figure 15:
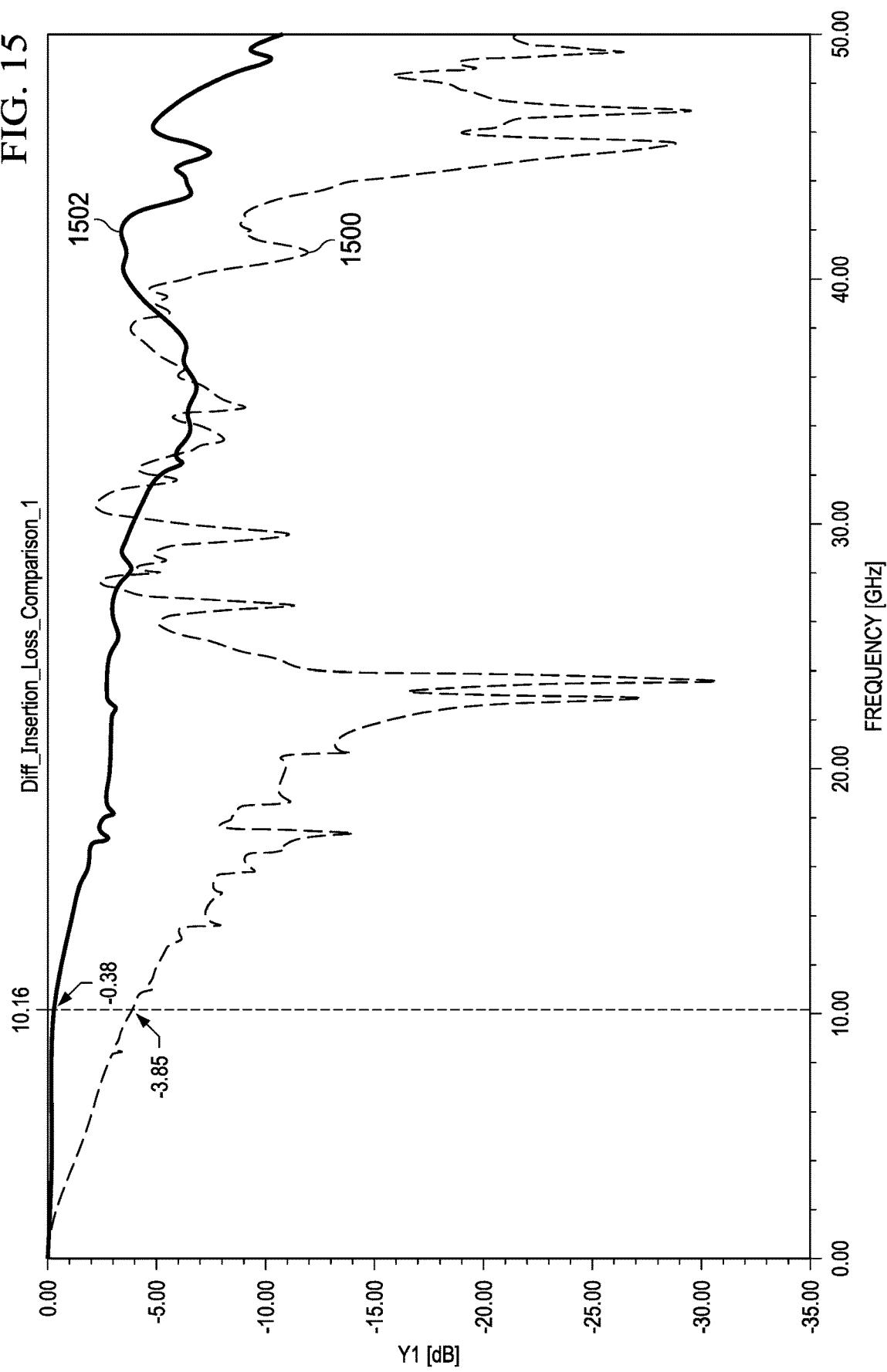
FIG. 15 is a graph depicting improvements in insertion loss associated with a semiconductor package that is in accordance with various examples.

FIG. 15 is a graph depicting improvements in insertion loss associated with a semiconductor package 1300 in accordance with various examples. The y-axis represents insertion losses, and the x-axis represents frequency in GHz. Curve 1500 demonstrates the behavior of other solutions, and curve 1502 demonstrates the behavior of the package 1300. As shown, curve 1500 demonstrates significant insertion losses in the frequency band of interest (e.g., 5 GHz to 38 GHz), while curve 1502 demonstrates no significant insertion losses.

Figure 16:
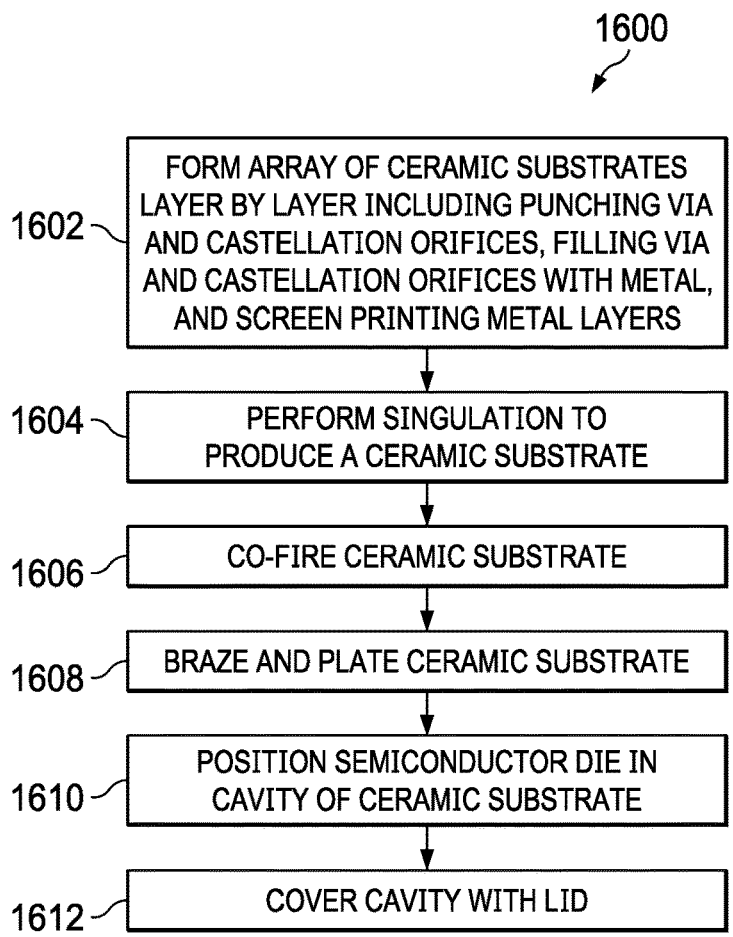
FIG. 16 is a flow diagram of a method in accordance with various examples.

FIG. 16 is a flow diagram of a method 1600 in accordance with various examples. The method 1600 begins with forming an array of ceramic substrates layer by layer including punching via and castellation orifices, filling the via and castellation orifices with metal, and screen printing the metal layers (1602). Step 1602 is performed iteratively, layer by layer, until the array of ceramic substrates is complete. The precise manner in which the orifices are punched and filled with metal, as well as the precise screen printing patterns used, are application specific. The castellations and metal layers may be formed in accordance with one or more examples described herein. The method 1600 includes performing a singulation technique on the array to produce an individual ceramic substrate (1604). The method 1600 includes co-firing the ceramic substrate (1606) (e.g., at a temperature up to 1600 degrees Celsius) and brazing and plating the ceramic substrate (1608). The method 1600 includes positioning a semiconductor die in a cavity of the ceramic substrate (1610) and covering the cavity with a lid using a vacuum technique to hermetically seal the cavity (1612).

Figure 17:
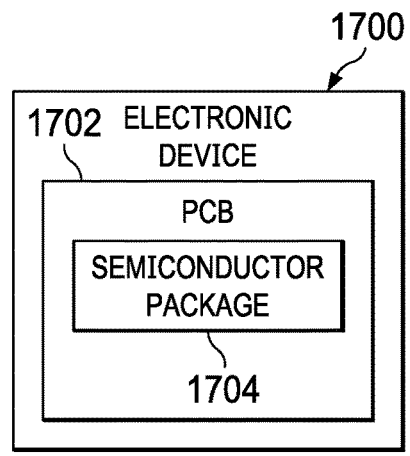
FIG. 17 is a block diagram of an electronic device in accordance with various examples.

FIG. 17 is a block diagram of an electronic device 1700 in accordance with various examples. The electronic device 1700 may include a personal electronic device (e.g., smartphones, laptop computers, desktop computers, tablets, notebooks, artificial intelligence assistants), an electronic appliance (e.g., refrigerators, microwave ovens, toaster ovens, dishwashers), a networking or enterprise-level electronic device or system (e.g., servers, routers, modems, mainframe computers, wireless access points), an automobile or aviation device or system (e.g., control panels, entertainment devices, navigation devices, power electronics), or any of a variety of other electronic devices or systems. The electronic device 1700 may include a PCB 1702. A semiconductor package 1704, such as any of the packages described herein, may be coupled to the PCB 1702.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Unless otherwise stated, "about," "approximately," or "substantially" preceding a value means+/−10 percent of the stated value. Modifications are possible in the described examples, and other examples are possible within the scope of the claims.

What is claimed is:

1. A semiconductor package, comprising:
a ceramic substrate;
a horizontal metal layer covered by the ceramic substrate, the horizontal metal layer configured to carry signals in the 5 GHz to 38 GHz frequency range; and
a vertical castellation on an outer surface of the ceramic substrate, the vertical castellation coupled to the horizontal metal layer; and
a second horizontal metal layer covered by the ceramic substrate and coupled to the second horizontal metal layer by way of one or more vias, wherein the second horizontal metal layer configured to carry signals in the 5 GHz to 38 GHz frequency range, the horizontal metal layer coupled to the vertical castellation at a first location and the second horizontal metal layer coupled to the vertical castellation at a second location.

2. The semiconductor package of claim 1, wherein the first and second locations are separated by a vertical distance that is at least 50 percent of the height of the vertical castellation.

3. The semiconductor package of claim 2, wherein the vertical distance is 100 percent of the height of the vertical castellation.

4. The semiconductor package of claim 3, wherein the second horizontal metal layer is above the horizontal metal layer, and wherein the second horizontal metal layer is not the topmost metal layer covered by the ceramic substrate.

5. The semiconductor package of claim 1, wherein the vertical castellation has a height ranging from 0.10 mm to 0.65 mm.

6. A semiconductor package, comprising:
a ceramic substrate;
first and second horizontal metal layers covered by the ceramic substrate and coupled to each other by way of one or more vias, the first and second metal layers configured to carry signals in the 5 GHz to 38 GHz frequency range; and
a vertical castellation on an outer surface of the ceramic substrate, the vertical castellation coupled to the first metal layer at a first location and to the second metal layer at a second location, the first and second locations separated by a vertical distance that is at least 50 percent of the height of the castellation.

7. The semiconductor package of claim 6, wherein the vertical castellation has a height ranging from 0.10 mm to 0.65 mm.

8. The semiconductor package of claim 6, wherein the vertical distance is 100 percent of the height of the vertical castellation.

9. The semiconductor package of claim 8, wherein the second metal layer is not the topmost metal layer covered by the ceramic substrate.

10. The semiconductor package of claim 6, wherein the first metal layer is the bottommost metal layer covered by the ceramic substrate.

11. The semiconductor package of claim 6, wherein the second metal layer is the topmost metal layer covered by the ceramic substrate.

12. A semiconductor package, comprising:
a semiconductor die within a ceramic substrate;
a horizontal metal layer terminating at a bottom of a vertical castellation, the vertical castellation on a side surface of the semiconductor package,
a via extending from the horizontal metal layer; and
a conductive trace connected to the via and a top of the vertical castellation, the conductive trace electrically connecting the vertical castellation to the semiconductor die, the vertical castellation including a height between the bottom and the top, wherein the horizontal metal layer is configured to carry signals in the 5 GHz to 38 GHz frequency range.

13. The semiconductor package of claim 12, wherein the conductive trace includes a non-linear shape from a top view of the semiconductor package.

14. A semiconductor package, comprising:
a semiconductor die within a ceramic substrate;
a horizontal metal layer terminating at a bottom of a vertical castellation, the vertical castellation on a side surface of the semiconductor package,
a via extending from the horizontal metal layer; and
a conductive trace connected to the via and the vertical castellation, the conductive trace electrically connecting the vertical castellation to the semiconductor die, the conductive trace including a non-linear shape from a top view of the semiconductor package.

15. The semiconductor package of claim 14, wherein the metal layer and the conductive trace are configured to carry signals in the 5 GHz to 38 GHz frequency range.

* * * * *